(12) United States Patent
Togura et al.

(10) Patent No.: US 8,547,116 B2
(45) Date of Patent: Oct. 1, 2013

(54) POSITION DETECTOR

(75) Inventors: Takeshi Togura, Sakura (JP); Koji Sakiyama, Sakura (JP)

(73) Assignee: Fujikura Ltd., Tokyo (JP)

( * ) Notice: Subject to any disclaimer, the term of this patent is extended or adjusted under 35 U.S.C. 154(b) by 335 days.

(21) Appl. No.: 13/100,374

(22) Filed: May 4, 2011

(65) Prior Publication Data

US 2011/0254571 A1   Oct. 20, 2011

Related U.S. Application Data

(63) Continuation-in-part of application No. PCT/JP2009/069180, filed on Nov. 11, 2009.

(30) Foreign Application Priority Data

Nov. 11, 2008   (JP) .................................. 2008-288973

(51) Int. Cl.
    *G01R 27/26*   (2006.01)
(52) U.S. Cl.
    USPC ........................................................ 324/679
(58) Field of Classification Search
    USPC ......... 324/679, 762.01–762.1, 750.01–750.3; 257/48; 438/14–18
    See application file for complete search history.

(56) References Cited

U.S. PATENT DOCUMENTS 5,973,417 A * 10/1999 Goetz et al. .................... 307/129
7,683,641 B2 * 3/2010 Hargreaves et al. ........... 324/686
2005/0275415 A1   12/2005 Sato et al.
2006/0278444 A1   12/2006 Binstead
2008/0122798 A1   5/2008 Koshiyama et al.

FOREIGN PATENT DOCUMENTS

| JP | 63-75919 A | 4/1988 |
| JP | 4-315089 A | 11/1992 |
| JP | 6-300509 A | 10/1994 |
| JP | 08-064364 A | 3/1996 |
| JP | 8-171449 A | 7/1996 |
| JP | 10-48344 A | 2/1998 |
| JP | 2005-49194 A | 2/2005 |
| JP | 2005-337773 A | 12/2005 |
| JP | 2006-177838 A | 7/2006 |
| JP | 2006-285518 A | 10/2006 |

(Continued)

OTHER PUBLICATIONS

International Search Report of PCT/JP2009/069180, mailing dated Feb. 23, 2010.

(Continued)

*Primary Examiner* — Tung X Nguyen
(74) *Attorney, Agent, or Firm* — Westerman, Hattori, Daniels & Adrian, LLP

(57) ABSTRACT

To enable position or distance of sensing target making approach, etc. to the range of sensing area to be detected securely with simple configuration at low cost and improve latitude of designing, position detector includes capacitance sensor unit and detecting circuit unit. Capacitance sensor unit includes first and second sensing electrodes and dielectric material therebetween. Dielectric material has range L of sensing area defined on its sensing surface. Detecting circuit unit includes selector switches SWA and SWB, capacitance sensing circuits, A/D converters, and arithmetic processing circuit. Arithmetic processing circuit judges and detects the position of sensing target in range L of sensing area based on detected values of capacitances C1 and C2 sensed by first and second sensing electrodes under switching control on selector switches SWA and SWB.

20 Claims, 13 Drawing Sheets

(56) References Cited

FOREIGN PATENT DOCUMENTS

| | | | |
|---|---|---|---|
| JP | 2006-527438 | A | 11/2006 |
| JP | 2008-117371 | A | 5/2008 |
| JP | 2008-203055 | A | 9/2008 |
| WO | 2004/114105 | A2 | 12/2004 |

OTHER PUBLICATIONS

Japanese Office Action dated May 8, 2012 for corresponding application No. 2008-129503.

* cited by examiner

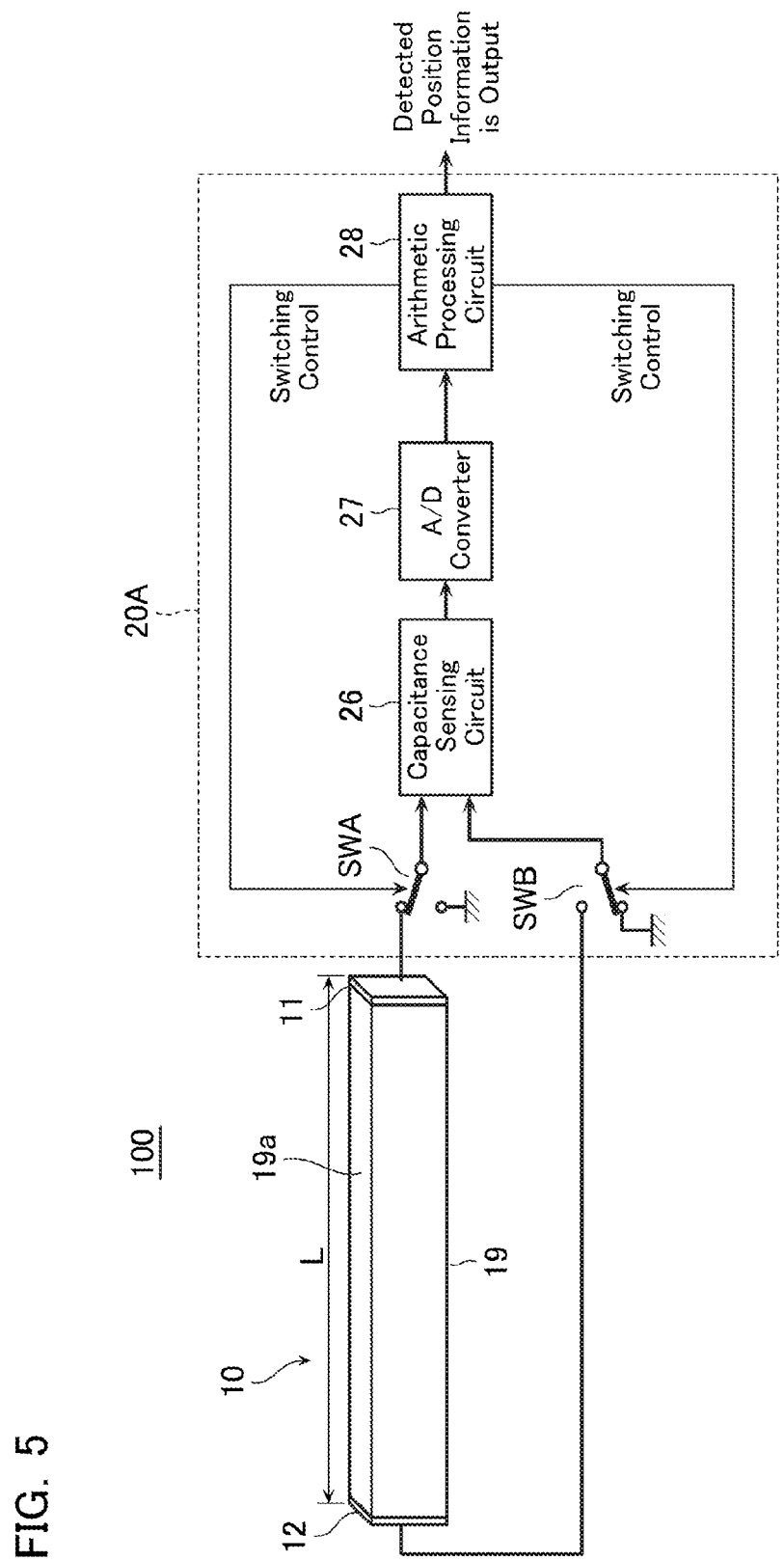

POSITION DETECTOR

CROSS-REFERENCES TO RELATED APPLICATIONS

This application is a continuation-in-part of International Application PCT/JP2009/069180, filed on Nov. 11, 2009, the disclosure of which is incorporated herein by reference in its entirety. This application claims priority under 35 U.S.C. §119 to Japanese Patent Application No. 2008-288973, filed on Nov. 11, 2008, the disclosure of which is incorporated herein by reference in its entirety.

BACKGROUND

1. Field of the Invention

The present invention relates to a position detector which senses an approach or a contact of a sensing target such as a human body based on a capacitance change or the like and judges and detects the position and distance of the sensing target.

2. Description of Related Art

For example, the followings have been known as techniques for sensing an approach, etc. of a sensing target such as a human body. A light blinking device disclosed in Patent Document 1 identified below includes an electrode which senses an approach of an object, and a capacitance-type sensor which senses a change of the capacitance of the electrode. The device also includes a time selecting circuit which responds to such a change of an output from the capacitance-type sensor as has a duration of 50 milliseconds to 120 milliseconds, and a control circuit which outputs lighting and extinguishing signals based on an output from the time selecting circuit. The device further includes a switch which is opened or closed based on an output from the control circuit, and whereby the device responds to a movement of a hand of an operator.

A capacitance-type approach sensor disclosed in Patent Document 2 identified below includes a sensor unit of which capacitance changes in response to an approach of a detection object, and a sensing circuit which outputs a sensing signal that is based on the capacitance of the sensor unit. When not detecting a detection object, the sensor observes a sensing signal corresponding to a circuit-specific initial capacitance value based on a calibration instruction. A subtracting voltage generating circuit generates a subtracting voltage for offsetting this sensing signal, and a subtracting circuit outputs a calibrated sensing signal by subtracting the subtracting voltage from the sensing signal.

The following configuration can be considered in order for the capacitance-type sensors (or capacitance-based sensors) disclosed in Patent Documents 1 and 2 to improve the resolving power for position-detecting an object (a detection object). That is, as shown in FIG. 14A, a plurality of sensing electrodes 301 to 305 are arranged highly densely, and capacitance sensing circuits 311 to 315 are provided for these sensing electrodes 301 to 305 respectively. Then, as shown in FIG. 14B, in order to reduce the number of circuits, such a number of switches (mechanical relays, analog switches, photo MOS relays, etc.) SW1 to SW4 as is equal to the number of electrodes (or smaller than the number of electrodes) are provided between a plurality of sensing electrodes 301 to 304 and one capacitance sensing circuit 311. Then, measurement is carried out by scanning the capacitance sensing circuit 311 connected to the sensing electrodes 301 to 304, etc.

[Patent document 1] JPH8-64364A
[Patent Document 2] JP2006-177838A

SUMMARY

However, in the sensors having such configurations as described above, an increase in the number of capacitance sensing circuits is problematic in that the capacitance sensing circuits are themselves expensive and that the circuit wiring will become complicated. This leads to a problem of cost increase. An effort to reduce the number of capacitance sensing circuits by providing a plurality of switches does not make a difference in the wiring complexity but raises a problem that a measurement time per one sensing electrode increases.

Moreover, because the sensors are arranged under a range of a sensing area, the configuration of the range of the sensing area is complicated. In this case, if, for example, a transparent design is applied to the range of the sensing area, the sensing electrodes become visible, which hinders the latitude of designing. Hence, an additional component is required for concealing the sensing electrodes and the configuration becomes complicated, which leads to cost increase just the same.

In order to solve the problems of the conventional art described above, the present invention aims for providing a position detector which can securely detect the position and distance of a sensing target which makes an approach, etc. to the range of the sensing area with a simple configuration and at a low cost, and which can improve the latitude of designing.

To solve the problems described above and achieve the object, a first position detector according to the present invention includes: a dielectric material having a sensing surface defining a range of a sensing area; a plurality of sensing electrodes which are provided in the vicinity of ends of the dielectric material, and which sense a capacitance between themselves and a sensing target; a detecting circuit which detects capacitance values that are based on sensing signals from the plurality of sensing electrodes; a plurality of selector switches which are capable of switching the plurality of sensing electrodes respectively between connection to the detecting circuit and connection to a ground potential or a certain fixed potential; and judging/detecting means which judges and detects at least one of a position of the sensing target on the sensing surface and a distance of the sensing target from the sensing surface based on detection results from the detecting circuit.

A second position detector according to the present invention includes: a dielectric material having a sensing surface defining a range of a sensing area; a plurality of sensing electrodes which are provided in the vicinity of ends of the dielectric material and which sense a capacitance between themselves and a sensing target; a detecting circuit which detects capacitance values which are based on sensing signals from the sensing electrodes; a dummy detecting circuit which supplies a same potential as that of any of the sensing electrodes that is connected to the detecting circuit to the other sensing electrode/s; a plurality of selector switches which are capable of switching the plurality of sensing electrodes respectively between connection to the detecting circuit and connection to the dummy detecting circuit; and judging/detecting means which judges and detects at least one of a position of the sensing target on the sensing surface and a distance of the sensing target from the sensing surface based on detection results from the detecting circuit.

A third position detector according to the present invention includes: a dielectric material having a sensing surface defining a range of a sensing area; a plurality of sensing electrodes which are provided in the vicinity of ends of the dielectric material and which sense a capacitance between themselves and a sensing target; a plurality of detecting circuits which detect capacitance values which are based on sensing signals from the plurality of sensing electrodes respectively, the plurality of detecting circuits being synchronized periodically; and judging/detecting means which judges and detects at least one of a position of the sensing target on the sensing surface and a distance of the sensing target from the sensing surface based on outputs from the plurality of detecting circuits.

By being configured as described above, the first to third position detectors according to the present invention can securely detect the position and distance of a sensing target that makes an approach, etc. to the range of the sensing area with a simple configuration and at a low cost.

In the first position detector according to the present invention, for example, the judging/detecting means judges and detects the position of the sensing target on the sensing surface based on a result of comparison between outputs from the detecting circuit, the outputs being obtained when the plurality of selector switches are switched so as to connect at least one of the plurality of sensing electrodes to the detecting circuit and the other/s to the ground potential or the fixed potential in order to sequentially switch between the sensing electrodes to select each of them as one to be connected to the detecting circuit.

In the first position detector according to the present invention, for example, the judging/detecting means judges and detects the distance of the sensing target from the sensing surface based on outputs from the detecting circuit, the outputs being obtained when the plurality of selector switches are switched so as to connect the plurality of sensing electrodes to the detecting circuit respectively.

In the first position detector according to the present invention, for example, the judging/detecting means judges and detects the distance of the sensing target from the sensing surface based on a sum of outputs from the detecting circuit, the outputs being obtained when the plurality of selector switches are switched so as to connect at least one of the plurality of sensing electrodes to the detecting circuit and the other/s to the ground potential or the fixed potential in order to sequentially switch between the sensing electrodes to select each of them as one to be connected to the detecting circuit.

In the first position detector according to the present invention, the position of the sensing target on the sensing surface and the distance of the sensing target from the sensing surface may be each judged and detected by controlling switching states of the plurality of selector switches at certain time intervals.

In the first position detector according to the present invention, for example, the detecting circuit may include: a plurality of capacitance sensing circuits which are connected one-to-one to the plurality of sensing electrodes through the plurality of selector switches respectively and which output information indicating capacitances sensed by the sensing electrodes respectively; and synchronizing means which synchronizes the capacitance sensing circuits, and the judging/detecting means may be configured by an arithmetic processing circuit which judges and detects at least one of the position of the sensing target on the sensing surface and the distance of the sensing target from the sensing surface by performing a comparison operation on capacitance values which are based on the information from the plurality of capacitance sensing circuits.

In the first position detector according to the present invention, for example, the detecting circuit may include a capacitance sensing circuit which is connected to the plurality of sensing electrodes through the plurality of selector switches respectively and which outputs information indicating capacitances sensed intertemporally by the sensing electrodes under a switching control on the selector switches, and the judging/detecting means may be configured by an arithmetic processing circuit which judges and detects at least one of the position of the sensing target on the sensing surface and the distance of the sensing target from the sensing surface by performing a comparison operation on capacitance values which are based on the information from the capacitance sensing circuit.

In the second position detector according to the present invention, for example, the judging/detecting means judges and detects the position of the sensing target on the sensing surface based on a result of comparison between outputs from the detecting circuit, the outputs being obtained when the plurality of selector switches are switched so as to connect at least one of the plurality of sensing electrodes to the detecting circuit and the other/s to the dummy detecting circuit in order to sequentially switch between the sensing electrodes to select each of them as one to be connected to the detecting circuit.

In the second position detector according to the present invention, for example, the judging/detecting means judges and detects the distance of the sensing target from the sensing surface based on outputs from the detecting circuit, the outputs being obtained when the plurality of selector switches are switched so as to connect the plurality of sensing electrodes to the detecting circuit respectively.

In the second position detector according to the present invention, for example, the judging/detecting means judges and detects the distance of the sensing target from the sensing surface based on a sum of outputs from the detecting circuit, the outputs being obtained when the plurality of selector switches are switched so as to connect at least one of the plurality of sensing electrodes to the detecting circuit and the other/s to the dummy detecting circuit in order to sequentially switch between the sensing electrodes to select each of them as one to be connected to the detecting circuit.

In the second position detector according to the present invention, the position of the sensing target on the sensing surface and the distance of the sensing target from the sensing surface may be each judged and detected by controlling switching states of the plurality of selector switches at certain time intervals.

In the second position detector according to the present invention, for example, the detecting circuit may include: a plurality of capacitance sensing circuits which are connected one-to-one to the plurality of sensing electrodes through the plurality of selector switches respectively and which output information indicating capacitances sensed by the sensing electrodes respectively; and synchronizing means which synchronizes the capacitance sensing circuits, and the judging/detecting means may be configured by an arithmetic processing circuit which judges and detects at least one of the position of the sensing target on the sensing surface and the distance of the sensing target from the sensing surface by performing a comparison operation on capacitance values which are based on the information from the plurality of capacitance sensing circuits.

In the second position detector according to the present invention, for example, the detecting circuit may include a capacitance sensing circuit which is connected to the plurality of sensing electrodes through the plural of selector switches respectively and which outputs information indicating capacitances which are sensed intertemporally by the sensing electrodes under a switching control on the selector switches, and the judging/detecting means may be configured by an arithmetic processing circuit which judges and detects at least one of the position of the sensing target on the sensing surface and the distance of the sensing target from the sensing surface by performing a comparison operation on capacitance values which are based on the information from the capacitance sensing circuit.

In the third position detector according to the present invention, the judging/detecting means judges and detects the position of the sensing target on the sensing surface based on a result of comparison between the outputs from the plurality of detecting circuits.

In the third position detector according to the present invention, the judging/detecting means judges and detects the distance of the sensing target from the sensing surface based on a sum of the outputs from the plurality of detecting circuits.

In the first to third position detectors according to the present invention, it is preferred that at least one of the plurality of sensing electrodes be arranged along a direction orthogonal to the sensing surface.

It is also preferred that the plurality of sensing electrodes be arranged such that their electrode surfaces face each other by sandwiching therebetween the sensing surface defining the range of the sensing area.

The dielectric material is made of, for example, a transparent or semitransparent material and formed into a cylindrical shape, a prism shape, or a flat panel shape. This enables to improve the latitude of designing in terms of aesthetic design, for example.

For example, the plurality of sensing electrodes include two sensing electrodes. It is preferred that the two sensing electrodes be arranged in a state connected to a pair of side surfaces of the dielectric material respectively.

For example, the plurality of sensing electrodes include four sensing electrodes. It is preferred that the four sensing electrodes be arranged in a state connected to one-circumferential-direction side surfaces of the dielectric material respectively.

For example, the plurality of sensing electrodes may be arranged such their electrode surfaces are orthogonal to the sensing surface.

For example, the plurality of sensing electrodes may be arranged such that their electrode surfaces are at an obtuse angle to the sensing surface, provided that the electrode surfaces face a direction toward the range of the sensing area.

For example, there may be shield electrodes which are provided on the back surfaces of the plurality of sensing electrodes opposite to their electrode surfaces, the shield electrodes being driven at a sensor potential while being insulated from the sensing electrodes respectively and shielding against sensing on the back surfaces of the plurality of sensing electrodes.

For example, there may be shield electrodes which are provided in a same plane as the electrode surfaces of the plurality of sensing electrodes so as to surround the circumferences of the electrode surfaces, the shield electrodes being driven at a sensor potential while being insulated from the sensing electrodes respectively and shielding against sensing on the circumferences of the plurality of sensing electrodes.

According to the present invention, it is possible to provide a position detector which can securely detect the position and distance of a sensing target that makes an approach, etc. to the range of a sensing area with a simple configuration and at a low cost, which can improve the latitude of designing.

BRIEF DESCRIPTION OF THE DRAWINGS

FIG. 5 is an explanatory diagram showing another example of the whole configuration of the position detector.

DETAILED DESCRIPTION OF THE INVENTION

Preferred embodiments of a position detector according to the present invention will be explained in detail below with reference to the attached drawings.

Figure 1:
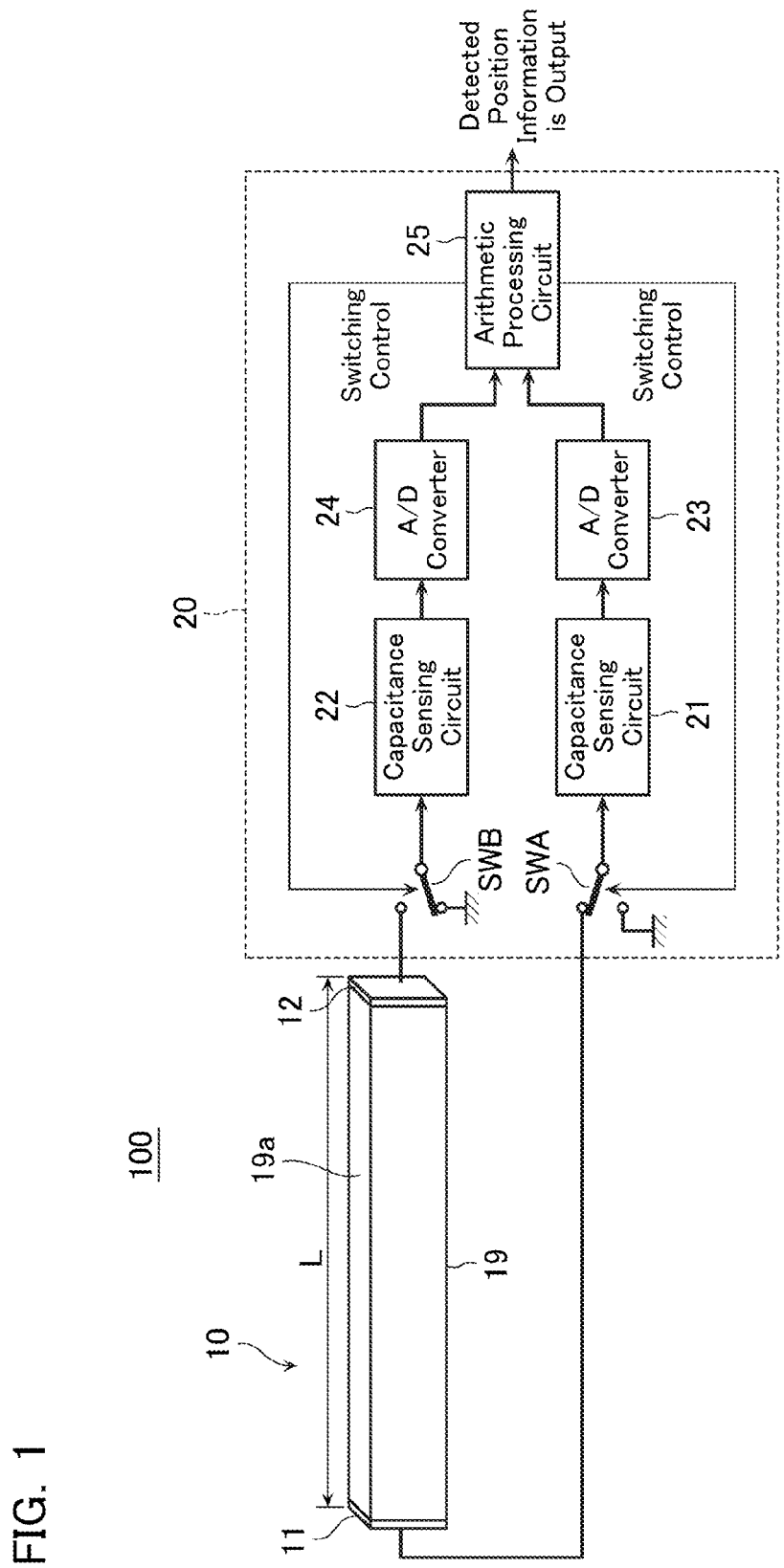
FIG. 1 is an explanatory diagram showing an example of a whole configuration of a position detector according to a first embodiment of the present invention.
Figure 2A:
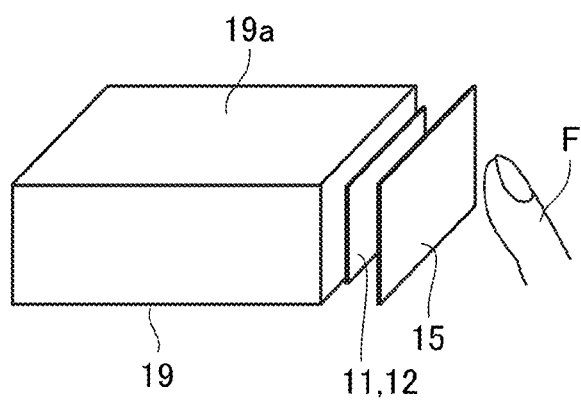
FIG. 2A is a perspective diagram showing another example of the configuration of a portion of the position detector.
Figure 2B:
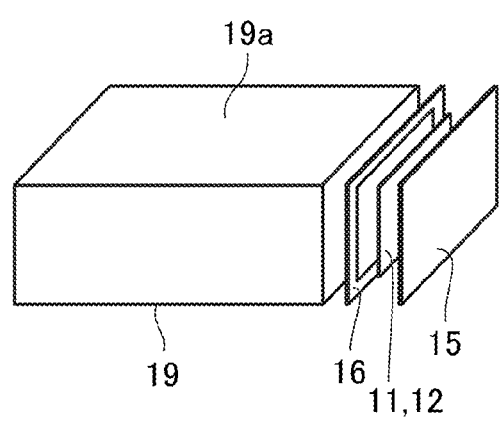
FIG. 2B is a perspective diagram showing another example of the configuration of a portion of the position detector.

FIG. 1 is an explanatory diagram showing an example of a whole configuration of a position detector according to a first embodiment of the present invention. FIGS. 2A and 2B are perspective diagrams showing another example of the configuration of a portion of the position detector. FIGS. 3A to 3D and FIGS. 4A to 4D are explanatory diagrams for explaining a position detecting operation of the position detector. FIG. 5 is an explanatory diagram showing another example of the whole configuration of the position detector.

As shown in FIG. 1, the position detector 100 includes a capacitance sensor unit 10 which is positioned at a place for sensing a sensing target such as a finger of a human body, and a detecting circuit unit 20 which is positioned either integrally with the capacitance sensor unit 10 through an unillustrated substrate or separately.

The capacitance sensor unit 10 senses an approach or a contact of a sensing target based on capacitance. The capacitance sensor unit 10 includes, for example, a plurality of sensing electrodes, namely a first sensing electrode 11 and a second sensing electrode 12, and a dielectric material 19 provided between these first and second sensing electrodes 11 and 12. The dielectric material 19 has on its one side surface a sensing surface 19a that defines a range L of a sensing area. The dielectric material 19 is made of plastic, ceramics, or some other material which is formed into a transparent or semitransparent prism shape. The dielectric material 19 has a relative permittivity of greater than 1, and in the present example, a relative permittivity that is sufficiently greater than 1 (e.g., 3).

The first and second sensing electrodes 11 and 12 are arranged within or near the range L of the sensing area of the dielectric material 19. The first and second sensing electrodes 11 and 12 can sense, based on capacitance, a sensing target that exists within the range L of the sensing area formed on the sensing surface 19a and that approaches or contacts the dielectric material 19. Here, the first and second sensing electrodes 11 and 12 are arranged such that they are connected to the dielectric material 19 in a state that their electrode surfaces (unillustrated) face each other on a pair of longer-direction side surfaces of the dielectric material 19 and that they sandwich the sensing surface 19a and are orthogonal to the sensing surface 19a.

Meanwhile, the detecting circuit unit 20 detects capacitance values that are based on sensing signals from the sensing electrodes 11 and 12 of the capacitance sensor unit 10. Then, the detecting circuit unit 20 judges and detects at least one of the position of a sensing target and the distance of the sensing target from the sensing surface 19a within the range L of the sensing area.

The detecting circuit unit 20 includes a selector switch SWA which drives the sensing electrodes 11 and 12 at a sensor potential and, for example, switches an input from the first sensing electrode 11 of the capacitance sensor unit 10 to either a capacitance sensing circuit 21 or a ground potential (or a certain fixed potential) different from the sensor potential. The detecting circuit unit 20 also includes a selector switch SWB which likewise switches an input from the second sensing electrode 12 to either a capacitance sensing circuit 22 or a ground potential (or a certain fixed potential) different from the sensor potential.

The detecting circuit unit 20 includes capacitance sensing circuits 21 and 22 which are electrically connected through the selector switches SWA and SWB and detect capacitance values that are based on sensing signals from the sensing electrodes 11 and 12. The detecting circuit unit 20 also includes A/D converters 23 and 24 which convert analog signals output by the capacitance sensing circuits 21 and 22 to digital signals respectively and output them. The detecting circuit unit 20 also includes an arithmetic processing circuit 25 which performs a comparison operation on the capacitance values based on the digital signals from the A/D converters 23 and 24 and as described above judges and detects the position and distance of the sensing target.

The arithmetic processing circuit 25 functions as judging/detecting means and is provided within the detecting circuit unit 20 in the present example, but may be provided separately from the detecting circuit unit 20. The arithmetic processing circuit 25 controls the position detector 100 on the whole, and also the switching operations of the selector switches SWA and SWB, for example. The switching operations of the selector switches SWA and SWB are executed sufficiently faster than the speed of movement of, for example, a finger of a human body (for example, at a speed of 100 ms or lower).

Furthermore, here, the arithmetic processing circuit 25 has a function as information outputting means. The arithmetic processing circuit 25 outputs information regarding the judged and detected position and distance of the sensing target (i.e., judgment/detection results) in a state displayable on an external display device (unillustrated), in a printable state, or in any other state allowing application to various available forms. Operations, etc of the capacitance sensing circuits 21 and 22 regarding detection of capacitance values will be described later.

The capacitance sensor unit 10 may be configured as follows. That is, as shown in FIG. 2A, the capacitance sensor unit 10 may include first shield electrodes 15 which are provided on the back surfaces of the first and second sensing electrodes 11 and 12 opposite to the electrode surfaces of these electrodes which are connected to the pair of side surfaces of the dielectric material 19 respectively. The first shield electrodes 15 are driven at the sensor potential while being insulated from the sensing electrodes 11 and 12 and shield against sensing on the back surfaces of the sensing electrodes 11 and 12.

In this way, sensing of a sensing target on the sensing surface 19a of the dielectric material 19 can be protected from being influenced by an approach of a finger F of a human body or the like to the back surfaces of the sensing electrodes 11 and 12.

As shown in FIG. 2B, the capacitance sensor unit 10 may include, in addition to the first shield electrodes 15 described above, second shield electrodes 16 which are provided in the same plane as the electrode surfaces of the sensing electrodes 11 and 12 so as to surround the circumference of the electrode surfaces. The second shield electrodes 16 are driven at the sensor potential while being insulated from the sensing electrodes 11 and 12 and shield against sensing on the circumference of the sensing electrodes 11 and 12.

In this way, sensing of a sensing target on the sensing surface 19a of the dielectric material 19 can be protected from being influenced not only from the back surfaces of the sensing electrodes 11 and 12 but also from the circumference of the electrode surfaces of the sensing electrodes 11 and 12.

Driving the first and second shield electrodes 15 and 16 at the sensor potential can be done by, for example, passing the sensor potential supplied to the sensing electrodes 11 and 12 through a unity gain amplifier (buffer) at a high input impedance and supplying the generated potential to the first and second shield electrodes 15 and 16. Alternatively, if the capacitance sensing circuits 21 and 22 are differentially operating type circuits, driving at the sensor potential can be done by, for example, connecting a non-inverting input portion of an operational amplifier to the first and second shield electrodes 15 and 16.

The capacitance sensor unit 10 may not only be arranged such that, as described above, the first and second sensing electrodes 11 and 12 are connected in the state that their electrode surfaces are orthogonal to the sensing surface 19a, but also be arranged such that the first and second electrodes 11 and 12 are connected in a state that their electrode surfaces are at an obtuse angle to the direction of the range L of the sensing area of the sensing surface 19a. This will make it easier to detect an approach of a finger F (or a palm) of a human body. For example, the larger the obtuse angle is, the easier it becomes to detect an approach of a finger F of a human body. Therefore, in a distance judging/detecting state to be described later for detecting an approach of a finger F to the range L of the sensing area, the angle may be set closer to 180 degrees if a high sensitivity for an approach of the finger F is needed, while it may be set to 90 degrees or close to 90 degrees if a high sensitivity is not needed. In this way, by changing the degree of obtuse angle, it becomes possible to adjust the sensitivity for an approach of a finger F of a human body. At least one of the first and second sensing electrodes 11 and 12 may be arranged along the direction orthogonal to the sensing surface 19a. Note that the electrode surfaces of the first and second sensing electrodes 11 and 12 are the surfaces facing a direction toward the range L of the sensing area.

Next, operations of the position detector 100 having such a configuration will be explained. First, an operation (operation 1) for a case when under a switching control by the arithmetic processing circuit 25, the first sensing electrode 11 and the capacitance sensing circuit 21 are connected to each other by the selector switch SWA and the second sensing electrode 12 is switched to the ground potential by the selector switch SWB will be explained.

In the case of the operation 1, connections within the detecting circuit unit 20 of the position detector 100 are as shown in FIG. 1. Here, when no sensing target (finger) is approaching or contacting the sensing surface 19a of the dielectric material 19 as shown in FIG. 3A, most of the lines of electric force P emitted from the first sensing electrode 11 enter the dielectric material 19, because the back surfaces of the sensing electrodes 11 and 12 are shielded by the first shield electrodes 15 as described above.

As described above, the dielectric material 19 has a relative permittivity that is sufficiently greater than 1, for example, about 3, which is sufficiently greater than the surrounding atmosphere. Therefore, the lines of electric force P inside the dielectric material 19 that are extending across the range L of the sensing area mostly do not leak to the outside but couple to the second sensing electrode 12 which is at the ground potential. In this condition, if in the range L of the sensing area, a position near the first sensing electrode 11 is defined as 0 (zero) in the X direction, a position near the second sensing electrode 12 can be detected as the farthest position (maximum value) in the X direction.

Figure 3A:
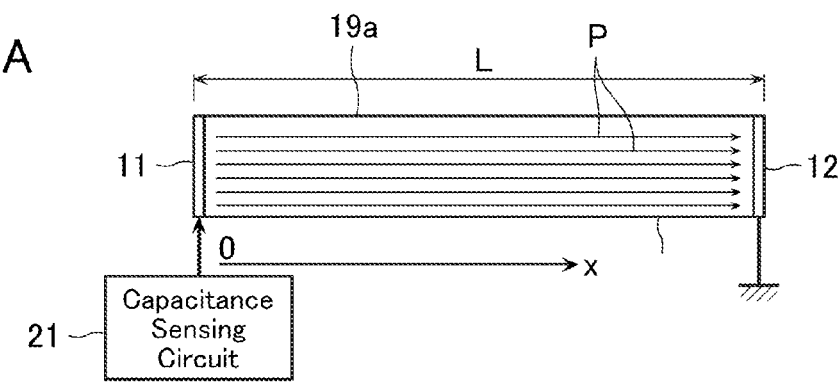
FIG. 3A is an explanatory diagram for explaining a position detecting operation of the position detector.
Figure 3B:
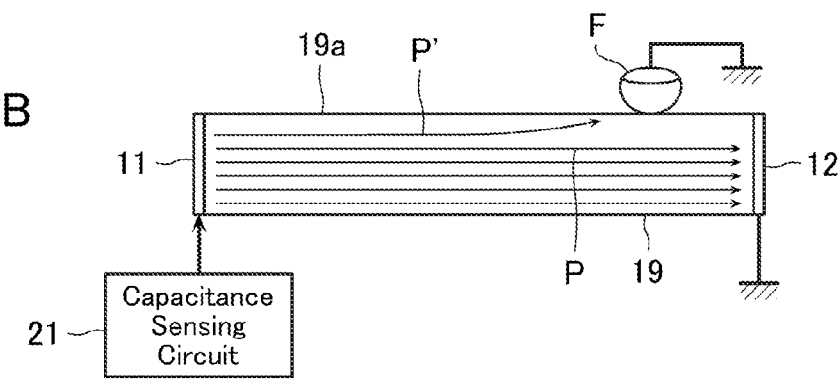
FIG. 3B is an explanatory diagram for explaining a position detecting operation of the position detector.
Figure 3C:
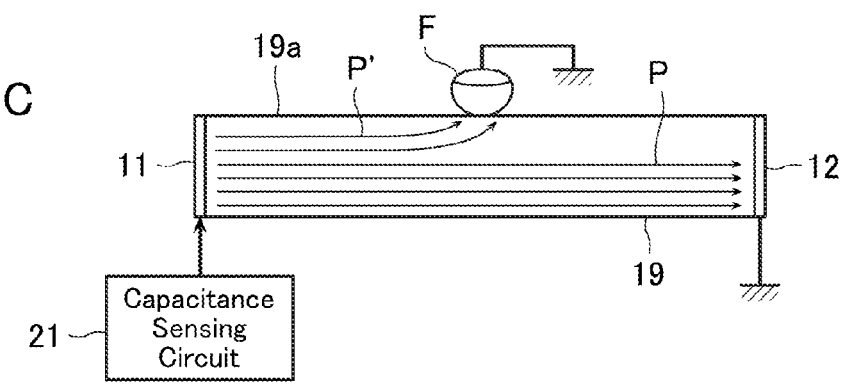
FIG. 3C is an explanatory diagram for explaining a position detecting operation of the position detector.
Figure 3D:
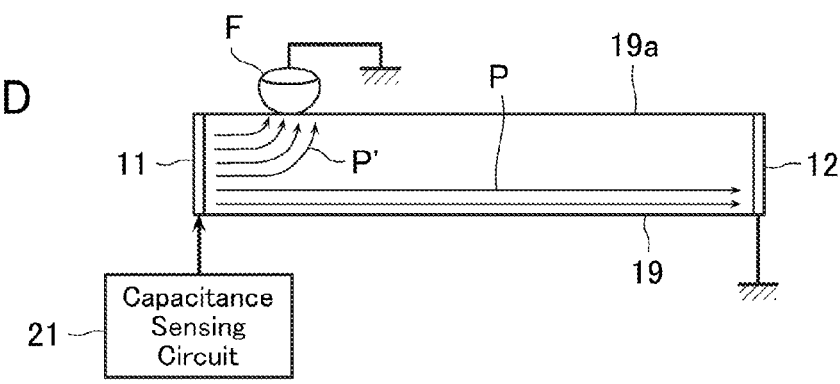
FIG. 3D is an explanatory diagram for explaining a position detecting operation of the position detector.

In such a condition, when a finger F touches an arbitrary position on the sensing surface 19a of the dielectric material 19 as shown in FIGS. 3B to 3D, at least some lines of electric force P' of the lines of electric force P couple to the finger F because the finger F (human body) can be considered equivalent to the ground (GND).

In this case, the capacitance value detected by the capacitance sensing circuit 21 in the states of FIGS. 3B to 3D is larger than that detected in the state of FIG. 3A (i.e., the capacitance increases). Therefore, it can be said that the device is set to detect a greater capacitance value than a reference when the finger F is contacting the sensing surface 19a (the states of FIGS. 3B to 3D), provided that the reference is obtained when no finger F is approaching or contacting the sensing surface 19a in the range L of the sensing area (the state of FIG. 3A).

In the case of FIG. 3B, the finger F is contacting the sensing surface 19a near the second sensing electrode 12. Therefore, the amount of lines of electric force P' that couple to the finger F is small, and the amount of increase in the capacitance is also small, which means that the capacitance value to be detected is small, although larger than the reference described above. At this time, the X-direction position of the finger F can be regarded as X>L/2.

In the case of FIG. 3C, the finger F is contacting the sensing surface 19a near the middle position between the first and second sensing electrodes 11 and 12. Therefore, the amount of lines of electric force P' that couple to the finger F is larger than in the case of FIG. 3A above and the amount of increase in the capacitance is also larger than this. Therefore, the capacitance value to be detected is larger than in the case of FIG. 3A, and the X-direction position of the finger F at this time can be regarded as, for example, X≈L/2 since the position is substantially at the middle of the range L of the sensing area.

In the case of FIG. 3D, the finger F is contacting the sensing surface 19a near the first sensing electrode 11. Therefore, the amount of lines of electric force P' that couple to the finger F is large, and the amount of increase in the capacitance is also large. Hence, the capacitance value to be detected is the largest. At this time, the X-direction position of the finger F can be regarded as X<L/2.

In this way, in the case of the operation 1 shown in FIGS. 3A to 3D, the X-direction position of the finger F contacting the sensing surface 19a and the detected capacitance value are related by a monotone decreasing function. Hence, the arithmetic processing circuit 25 can judge and detect the position of the finger F in the operation 1 based on this monotone decreasing function.

Next, an operation (operation 2) for a case when under a switching control by the arithmetic processing circuit 25, the first sensing electrode 11 is switched to the ground potential by the selector switch SWA and the second sensing electrode 12 and the capacitance sensing circuit 22 are connected to each other by the selector switch SWB will be explained. In the case of the operation 2, connections within the detecting circuit unit 20 of the position detector 100 are different from those shown in FIG. 1, particularly in that the connections of the selector switches SWA and SWB are the contrary.

Figure 4A:
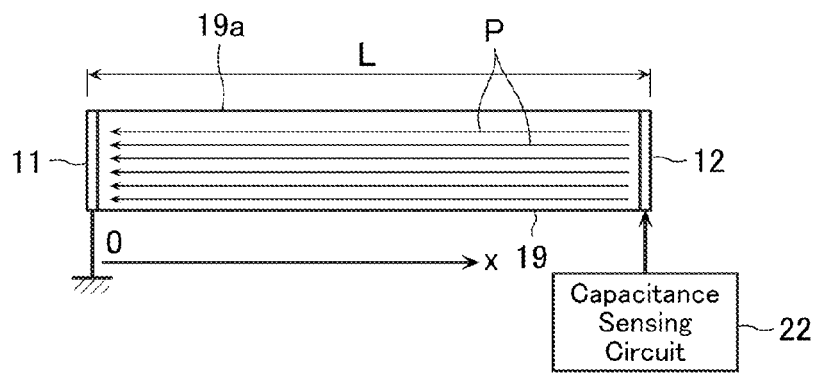
FIG. 4A is an explanatory diagram for a position detecting operation of the position detector.

Here, when no sensing target (finger) is approaching or contacting the sensing surface 19a of the dielectric material 19 as shown in FIG. 4A, most of the lines of electric force P emitted from the second sensing electrode 12 enter the dielectric material 19, because the back surfaces of the sensing electrodes 11 and 12 are shielded by the first shield electrodes 15.

Like as described above, the dielectric material 19 has a relative permittivity that is sufficiently greater than 1. Therefore, the lines of electric force P inside the dielectric material 19 that are extending across the range L of the sensing area mostly do not leak to the outside but couple to the first sensing electrode 11 which is at the ground potential. Here, likewise, in the range L of the sensing area, a position near the first sensing electrode 11 is defined as 0 (zero) in the X direction, and a position near the second sensing electrode 12 is defined as the farthest position in the X direction.

Figure 4B:
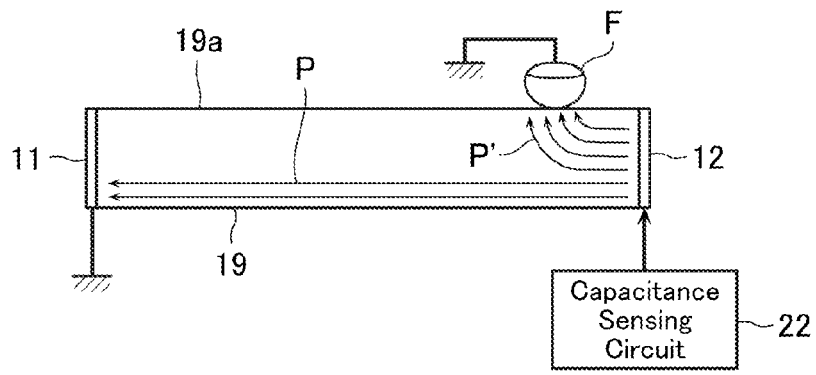
FIG. 4B is an explanatory diagram for a position detecting operation of the position detector.
Figure 4C:
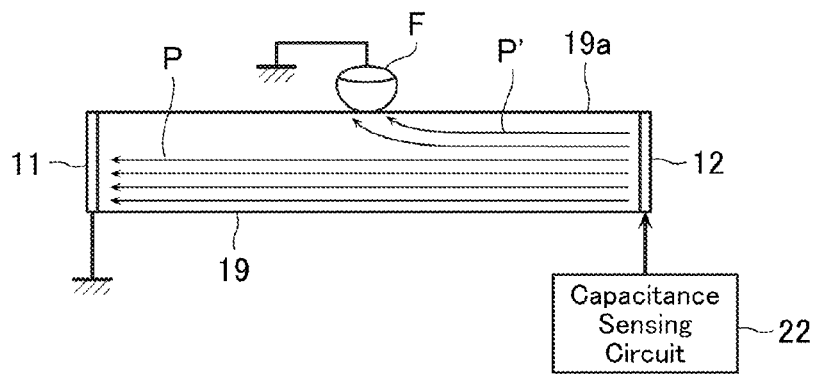
FIG. 4C is an explanatory diagram for a position detecting operation of the position detector.
Figure 4D:
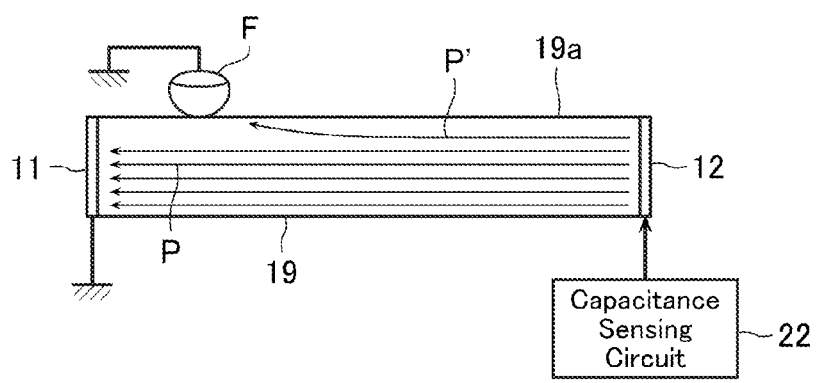
FIG. 4D is an explanatory diagram for a position detecting operation of the position detector.

In such a condition, the finger F touches an arbitrary position on the sensing surface 19a of the dielectric material 19 as shown in FIGS. 4B to 4D. Then, like as described above, at least some lines of electric force P' of the lines of electric force P couple to the finger F. Also in this case, the capacitance value to be detected by the capacitance sensing circuit 22 in the states of FIGS. 4B to 4D is larger than that detected in the state of FIG. 4A.

In the case of FIG. 4B, the finger F is contacting the sensing surface 19a near the second sensing electrode 12. Therefore, the amount of lines of electric force P' that couple to the finger F is large, and the amount of increase in the capacitance is also large. Hence, the capacitance value to be detected is the largest. At this time, the X-direction position of the finger F can be regarded as X>L/2.

In the case of FIG. 4C, the finger F is contacting the sensing surface 19a near the middle position between the first and second sensing electrodes 11 and 12. Therefore, the amount of lines of electric force P' that couple to the finger F is larger than in the case of FIG. 4A above but smaller than in the case of FIG. 4B. Hence, the capacitance value to be detected is smaller than in the case of FIG. 4B. The X-direction position of the finger F at this time can be regarded as, for example, X≈L/2 since the position is substantially at the middle of the range L of the sensing area.

In the case of FIG. 4D, the finger F is contacting the sensing surface 19a near the first sensing electrode 11. Therefore, the amount of lines of electric force P' that couple to the finger F is larger than in the case of FIG. 4A but smaller than in even the case of FIG. 4C. Hence, the capacitance value to be detected is smaller than in the case of FIG. 4C, and the X-direction position of the finger F at this time can be regarded as X<L/2.

In this way, in the case of the operation 2 shown in FIGS. 4A to 4D, the X-direction position of the finger F contacting the sensing surface 19a and the detected capacitance value are related by a monotone increasing function. Therefore, the arithmetic processing circuit 25 can judge and detect the position of the finger F in the operation 2 based on this monotone increasing function.

More specifically, when the detected value in the operation 1 is defined as $C1(x)$ and the detected value in the operation 2 is defined as $C2(x)$, the arithmetic processing circuit 25 can judge and detect the position of the finger F within the range L of the sensing area on the sensing surface 19a correctly by performing a comparison operation on these values. In this case, the position of the finger F can be represented as, for example, a ratio between $C1(x)$ and $C2(x)$, which may be a function $C1(x)/C2(x)$ or a function $C1(x)/(C1(x)+C2(x))$.

FIG. 5 is an explanatory diagram showing another example of the whole configuration of the position detector according to the first embodiment of the present invention. In the following explanation, any portions that are the same as the portions already explained will be denoted by the same reference numerals and might not be explained again, and any portions that are not particularly relevant to the present invention might not be set forth.

As shown in FIG. 5, the position detector 100 in this example is the same as the foregoing example in that it comprises a capacitance sensor unit and a detecting circuit unit as described above. However, the configuration of the detecting circuit unit 20A is different from that of the detecting circuit unit 20 of the foregoing example.

That is, the detecting circuit unit 20A is the same in that it includes a plurality of selector switches SWA and SWB which are connected to the first and second sensing electrodes 11 and 12 respectively and one arithmetic processing circuit 28. However, the detecting circuit unit 20A is different in that the selector switches SWA and SWB are connected to one capacitance sensing circuit 26 which is connected to one A/D converter 27.

In this case, switching of connection of the selector switches SWA and SWB to the capacitance sensing circuit 26 or to the ground potential is performed at certain time intervals alternately under a switching control of the arithmetic processing circuit 28 (i.e., in a way not to connect both the sensing electrodes 11 and 12 to the capacitance sensing circuit 26 at the same time). Then, by obtaining such detected values $C1(x)$ and $C2(x)$ as are obtained in the operation 1 and operation 2 described above, the arithmetic processing circuit 28 can judge and detect the position of the finger F in the range L of the sensing area on the sensing surface 19a correctly.

According to this configuration, the number of capacitance sensing circuits and the number of A/D converters can be reduced from the numbers included in the detecting circuit unit 20. This makes it possible to perform correct and secure position detection of the finger F at a lower cost.

Figure 6:
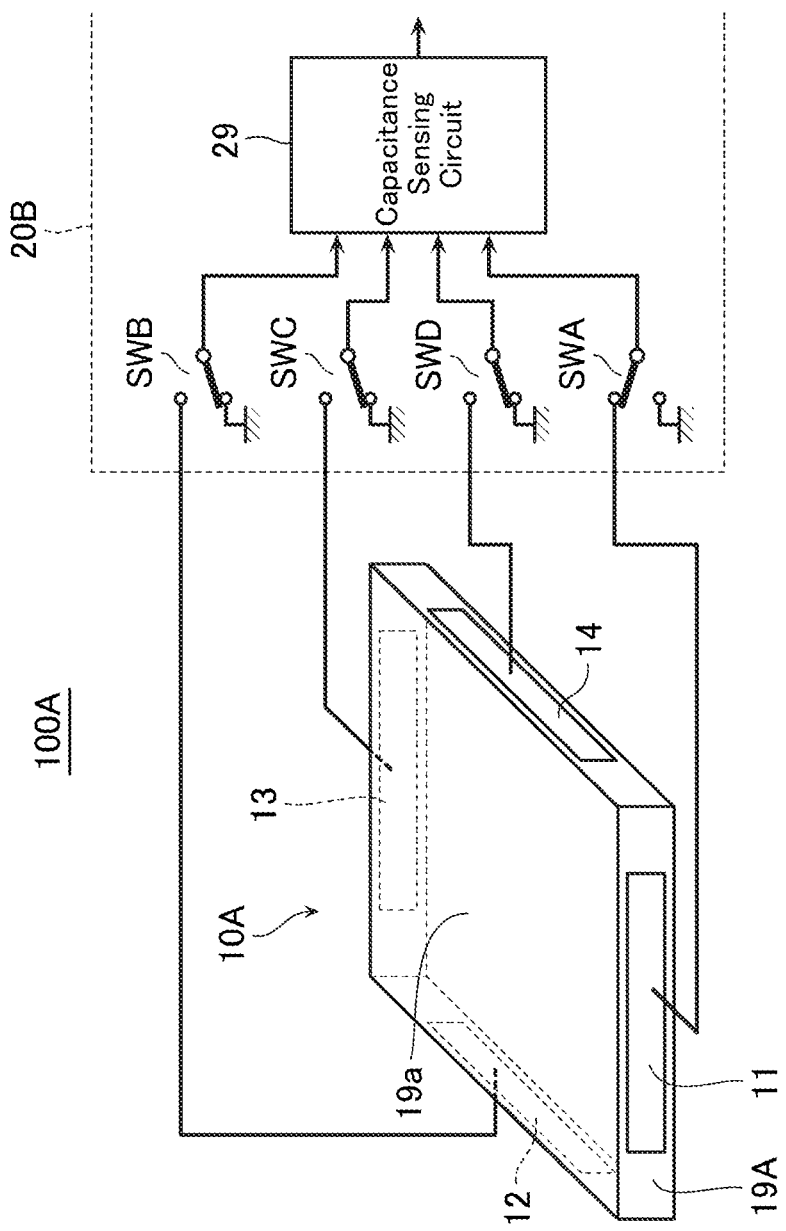
FIG. 6 is an explanatory diagram showing an example of a portion of a whole configuration of a position detector according to a second embodiment of the present invention.

FIG. 6 is an explanatory diagram showing an example of a portion of a whole configuration of a position detector according to a second embodiment of the present invention. As shown in FIG. 6, the position detector 100A according to the present example is the same as the position detector 100 according to the first embodiment in that it comprises a capacitance sensor unit and a detecting circuit unit (only a part of which is illustrated). However, the capacitance sensor unit 10A and the detecting circuit unit 20B are different from the first embodiment in the configuration, namely in that they judge and detect the position of the finger F not only in the X direction but also in the Y direction to be able to perform position detection two-dimensionally.

The capacitance sensor unit 10A has a dielectric material 19A that is formed into a shape of a flat panel, which has a sensing surface 19a on its principal surface and has a first sensing electrode 11, a second sensing electrode 12, a third sensing electrode 13, and a fourth sensing electrode 14 connected to its four side surfaces that surrounds the sensing surface 19a. The detecting circuit unit 20B includes selector switches SWA, SWB, SWC, and SWD which are connected to these sensing electrodes 11 to 14 respectively and to one capacitance sensing circuit 29. With a concern for aesthetic design, etc., the first sensing electrode 11 to fourth sensing electrode 14 may be provided inside the side surfaces of the dielectric material 19.

The position detector 100A having such a configuration performs the following operation, for example. First, an unillustrated arithmetic processing circuit thereof sets an origin (x0, y0) in the range of a rectangular sensing area formed on the sensing surface 19a. When a finger F is approaching or contacting the range of the sensing area on the sensing surface 19a, the arithmetic processing circuit performs simultaneous control of switching of the selector switches SWA to SWD at least four times in this case, and thereby obtains a detected value at each of these times.

That is, when, for example, the selector switch SWA is switched to connect the first sensing electrode 11 to the capacitance sensing circuit 29 as an operation A, the other selector switches SWB, SWC, and SWD switch the second sensing electrode 12 to the fourth sensing electrode 14 to be connected to a ground potential (or a certain fixed potential; the same applies hereinafter). A capacitance value detected by the capacitance sensing circuit 29 based on the capacitance from the first sensing electrode 11 at this time is stored in the arithmetic processing circuit as a detected value $C1(x, y)$.

Next, when, for example, the selector switch SWB is switched to connect the second sensing electrode to the capacitance sensing circuit 29 as an operation B, the other selector switches SWA, SWC, and SWD switch the first sensing electrode, the third sensing electrode 13, and the fourth electrode 14 to be connected to the ground potential. A capacitance value detected by the capacitance sensing circuit 29 based on the capacitance from the second sensing electrode 12 at this time is stored in the arithmetic processing circuit as a detected value $C2(x, y)$.

Further, when, for example, the selector switch SWC is switched to connect the third sensing electrode 13 to the capacitance sensing circuit 29 as an operation C, the other selector switches SWA, SWB, and SWD switch the first sensing electrode 11, the second sensing electrode 12, and the fourth sensing electrode 14 to be connected to the ground potential. A capacitance value detected by the capacitance sensing circuit 29 based on the capacitance from the third sensing electrode 13 at this time is stored in the arithmetic processing circuit as a detected value $C3(x, y)$.

Finally, when, for example, the selector switch SWD is switched to connect the fourth sensing electrode 14 to the capacitance sensing circuit 29 as an operation D, the other selector switches SWA to SWC switch the first sensing electrode 11 to the third sensing electrode 13 to be connected to the ground potential. A capacitance value detected by the capacitance sensing circuit 29 based on the capacitance from the fourth sensing electrode 14 at this time is stored in the arithmetic processing circuit as a detected value $C4(x, y)$.

Then, the arithmetic processing circuit judges and detects the X and Y-direction two-dimensional position of the finger F in the range of the sensing area on the sensing surface 19a by performing a comparison operation on these detected values C1 to C4. In this way, the position detector 100A according to the second embodiment can judge and detect the position of the finger F in the range of the sensing area on the sensing surface 19a two-dimensionally correctly.

The position detectors 100 and 100A according to the first and second embodiments described above have been explained in terms of their position judging/detecting state for judging the position of the finger F in the range of the sensing area. However, these position detectors 100 and 100A can also implement a distance judging/detecting state for detecting the distance of an approaching finger F from the sensing surface 19a in the range of the sensing area.

That is, when in the distance judging/detecting state, under a switching control of the arithmetic processing circuit 25, etc., the position detectors 100 and 100A switch all of the selector switch SWA, etc. of the detecting circuit units 20, 20A, and 20B so as to connect all of the sensing electrode 11, etc. of the capacitance sensor units 10 and 10A to all of the capacitance sensing circuit 21, etc. Then, the arithmetic processing circuit 25, etc. perform a comparison operation on capacitance values that are based on capacitances sensed by all of these sensing electrode 11, etc. between themselves and the finger F that couples to the sensing electrode 11, etc. through the dielectric materials 19 and 19A. Then, the arithmetic processing circuit 25, etc. calculate the distance of the finger F (sensing target) from the sensing surface 19a. The method of calculating the distance by using capacitance values will not be explained here because it is a publicly-known art.

By implementing the position judging/detecting state and the distance judging/detecting state described above by switching between them at certain time intervals, it becomes possible to detect the position of the sensing target and the distance thereof from the sensing surface in the range of the sensing area compositively with one position detector. Next, another distance judging method in the distance judging/detecting state will be explained. In the embodiments shown in FIG. 1 and FIG. 5, the capacitance to be detected is evaluated as C1 (or C2), or the sum of these values C1+C2. These values are dependent on both the position in the X direction of the dielectric material 19 and the distance to the dielectric material 19. Here, C1/C2, C1/(C1+C2), etc. are substantially not dependent on the distance to the dielectric material but are dependent only on X. Therefore, C1/C2 or C1/(C1+C2) may be calculated first to obtain X, and then a distance corresponding to the obtained X may be obtained.

Figure 7:
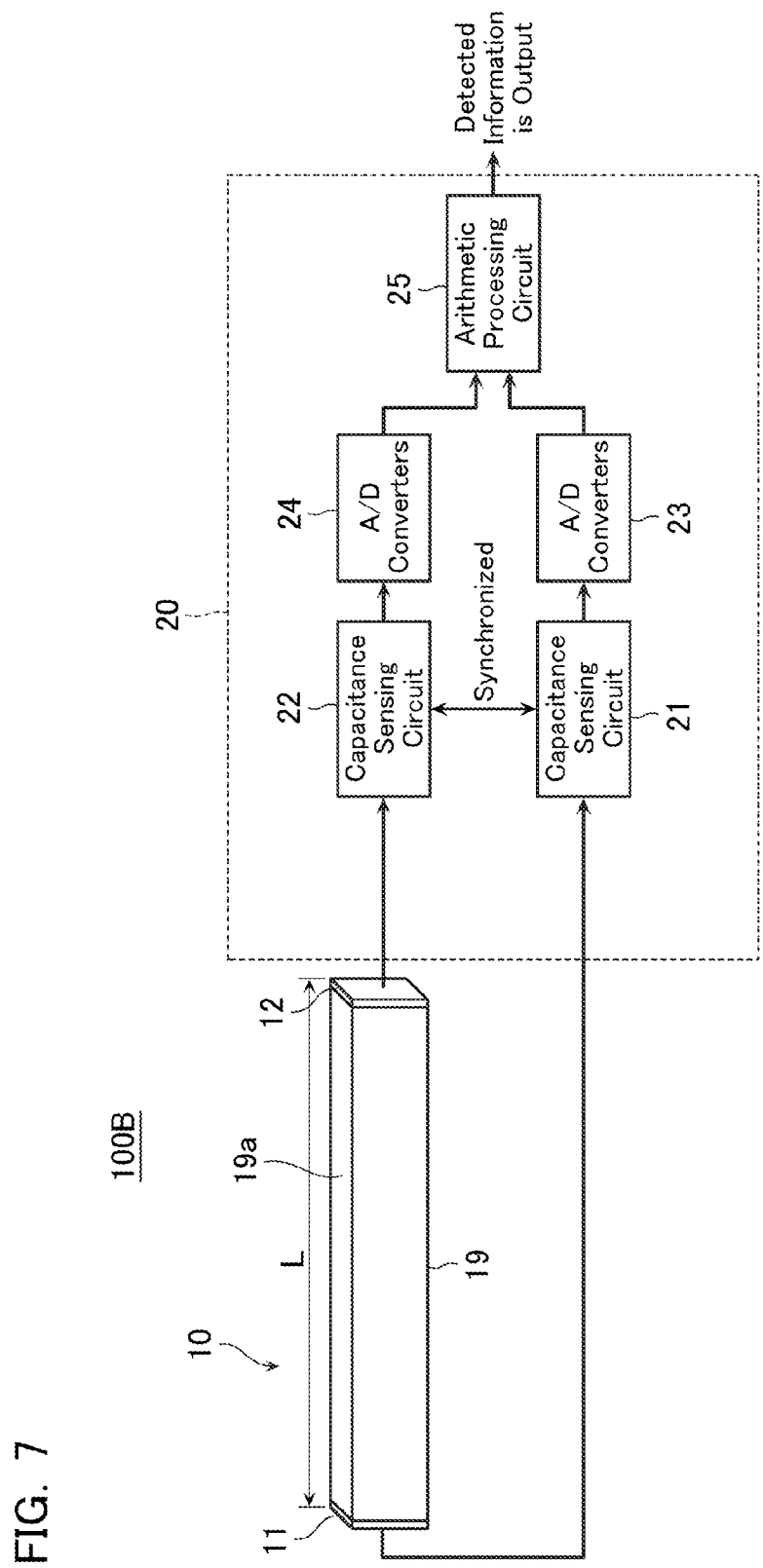
FIG. 7 is an explanatory diagram showing an example of a whole configuration of a position detector according to a third embodiment of the present invention.

FIG. 7 is an explanatory diagram showing an example of a whole configuration of a position detector according to a third embodiment of the present invention. FIGS. 8A to 8D are explanatory diagrams for explaining a position judging/detecting operation of this position detector. A detecting circuit unit 20 of the position detector 100B according to the third embodiment includes capacitance sensing circuits 21 and 22 which, for example, drive sensing electrodes 11 and 12 at a sensor potential and detect capacitance values based on sensing signals from the sensing electrodes 11 and 12. The detecting circuit unit 20 also includes A/D converters 23 and 24 which convert analog signals output by the capacitance sensing circuits 21 and 22 to digital signals respectively and output them. The detecting circuit unit 20 also includes an arithmetic processing circuit 25 which calculates a capacitance value based on the digital signals from the A/D converters 23 and 24 and judge and detect the position and distance of the sensing target as described above.

The arithmetic processing circuit 25 functions as judging/detecting means and is provided within the detecting circuit unit 20 in the present example. However, the arithmetic processing circuit 25 may be provided separately from the detecting circuit unit 20, and for example, controls the capacitance sensing circuits 21 and 22 to operate periodically synchronously. That is, the arithmetic processing circuit 25 controls the operations of the capacitance sensing circuits 21 and 22 and supplies a sensor potential to the sensing electrodes 11 and 12. The arithmetic processing circuit 25 repeats measuring capacitances and resetting the measurement conditions once measurement values are obtained, and averages the capacitance values obtained from this repetition, thereby improving the measurement accuracy (sensing accuracy).

In this way, the arithmetic processing circuit 25 controls the operations of the capacitance sensing circuits 21 and 22 and at the same time controls the position detector 100B on the whole. Specifically, the arithmetic processing circuit 25 judges and detects the position of a sensing target by a comparison operation described above, and also judges and detects the distance of the sensing target from the sensing surface 19a by calculating the sum of capacitance values from the capacitance sensing circuits 21 and 22.

Figure 8A:
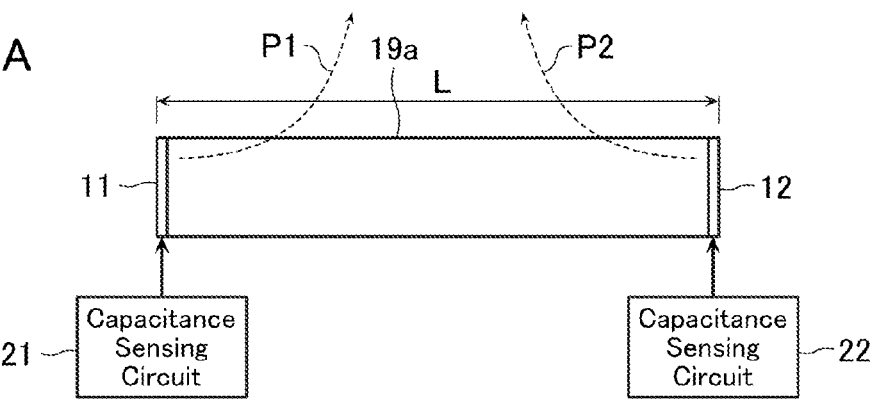
FIG. 8A is an explanatory diagram for explaining a position judging/detecting operation of the position detector.

Next, operations for position judgment/detection of the position detector 100B having such a configuration will be explained. First, an operation for a case when no finger F of a human body is existing near the range L of the sensing area will be explained. In this case, as shown in FIG. 8A, the sensing electrodes 11 and 12 are merely coupling to the surrounding ground (GND) weakly and the longer-direction both ends of the dielectric material 19 are at the same potential, because the back surfaces of the sensing electrodes 11 and 12 are shielded by the first shield electrodes 15 and the sensing electrodes 11 and 12 are synchronized. Hence, the lines of electric force P1 and P2 emitted from the first and second sensing electrodes 11 and 12 leak to the outside and almost none of them remain inside the dielectric material 19.

Figure 8B:
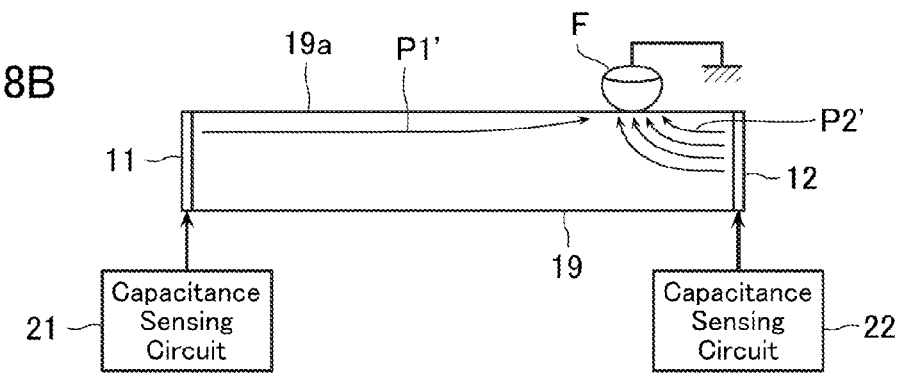
FIG. 8B is an explanatory diagram for explaining a position judging/detecting operation of the position detector.
Figure 8C:
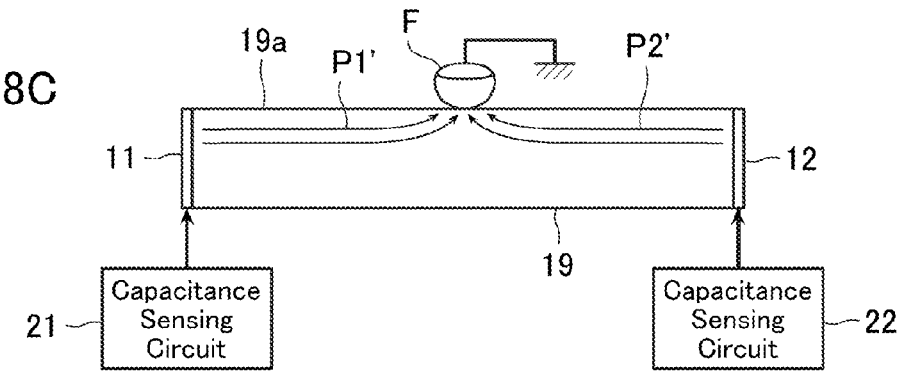
FIG. 8C is an explanatory diagram for explaining a position judging/detecting operation of the position detector.
Figure 8D:
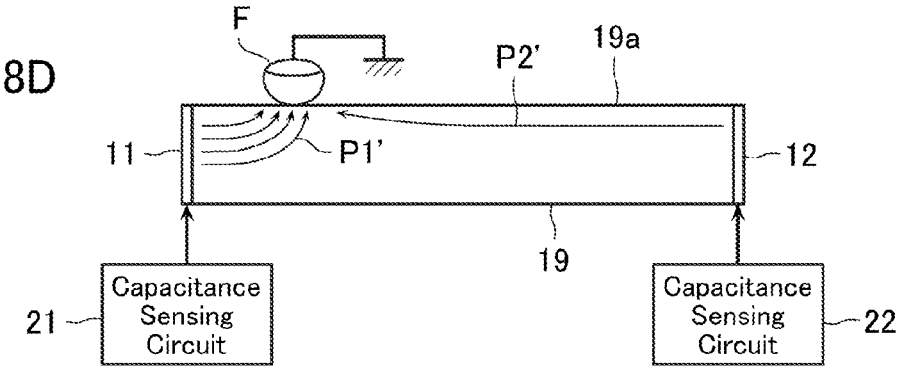
FIG. 8D is an explanatory diagram for explaining a position judging/detecting operation of the position detector.

Next, an operation for when a finger F is in the range L of the sensing area will be as shown in FIGS. 8B to 8D. That is, when a finger F of a human body touches an arbitrary position on the sensing surface 19a of the dielectric material 19, at least some lines of electric force P1' and P2' of the lines of electric force P1 and P2 couple to the finger F because the finger F can be considered equivalent to the ground. Therefore, the capacitance values to be detected by the capacitance sensing circuits 21 and 22 are larger than in the case shown in FIG. 8A (i.e., the capacitance increases).

Hence, as an assumption, the capacitance value to be detected when, for example, the finger F is contacting the sensing surface 19a (the states of FIGS. 8B to 8D) is larger than a reference, provided that the reference is obtained when no finger F is approaching or contacting the sensing surface 19a in the range L of the sensing area (the state of FIG. 8A).

First, in the case of FIG. 8B, the finger F is contacting the sensing surface 19a near the second sensing electrode 12. Therefore, the amount of lines of electric force P2' that couple to the finger F is larger than the amount of lines of electric force P1' that couple to the finger F, and hence the capacitance value detected by the capacitance sensing circuit 22 is larger. For example, if in the range L of the sensing area, a position near the first sensing electrode 11 is defined as 0 (zero) in the X direction, a position near the second sensing electrode 12 can be detected as the farthest position (maximum value) in the X direction. Therefore, in this case, the X-direction position of the finger F can be regarded as $X > L/2$.

In the case of FIG. 8C, the finger F is contacting the sensing surface 19a near the middle position between the first and second sensing electrodes 11 and 12. Therefore, the amounts of lines of electric force P1' and P2' that couple to the finger F are larger than in the case of FIG. 8A described above, and the capacitance values detected by the capacitance sensing circuits 21 and 22 are substantially equal. Therefore, the X-direction position of the finger F can be regarded as, for example, $X \approx L/2$ since the position is substantially at the middle of the range L of the sensing area.

In the case of FIG. 8D, the finger F is contacting the sensing surface 19a near the first sensing electrode 11. Therefore, the amount of lines of electric force P1' that couple to the finger F is larger than the amount of lines of electric force P2' that couple to the finger F, and the capacitance value detected by the capacitance sensing circuit 21 is larger. At this time, the X-direction position of the finger F can be regarded as $X < L/2$.

In this way, in the operations shown in FIGS. 8A to 8D, the X-direction position of the finger F contacting the sensing surface 19a and the detected capacitance value are related by a monotone increasing function. Therefore, the arithmetic processing circuit 25 can judge and detect the position of the finger F based on this monotone increasing function. For example, if the value detected by the capacitance sensing circuit 21 in the cases shown in FIGS. 8A to 8D (the value being the amount of increase in the capacitance from when no finger F is existing near the range L of the sensing area) is defined as $C1(x)$ and the value detected by the capacitance sensing circuit 22 in the same cases is defined as $C2(x)$, the position of the finger F on the sensing surface 19a can be calculated by the arithmetic processing circuit 25 by performing a comparison operation on $C1(x)$ and $C2(x)$. The function formula at this time can be represented as, for example, $C1(x)/C2(x)$ and $C1(x)/\{C1(x)+C2(x)\}$.

In an operation for distance judgment/detection, the distance from the sensing surface 19a of a finger F that is not contacting the sensing surface 19a in the range L of the sensing area can be judged and detected by the arithmetic processing circuit 25 by calculating the sum of the detected values $C1(x)$ and $C2(x)$.

Figure 9:
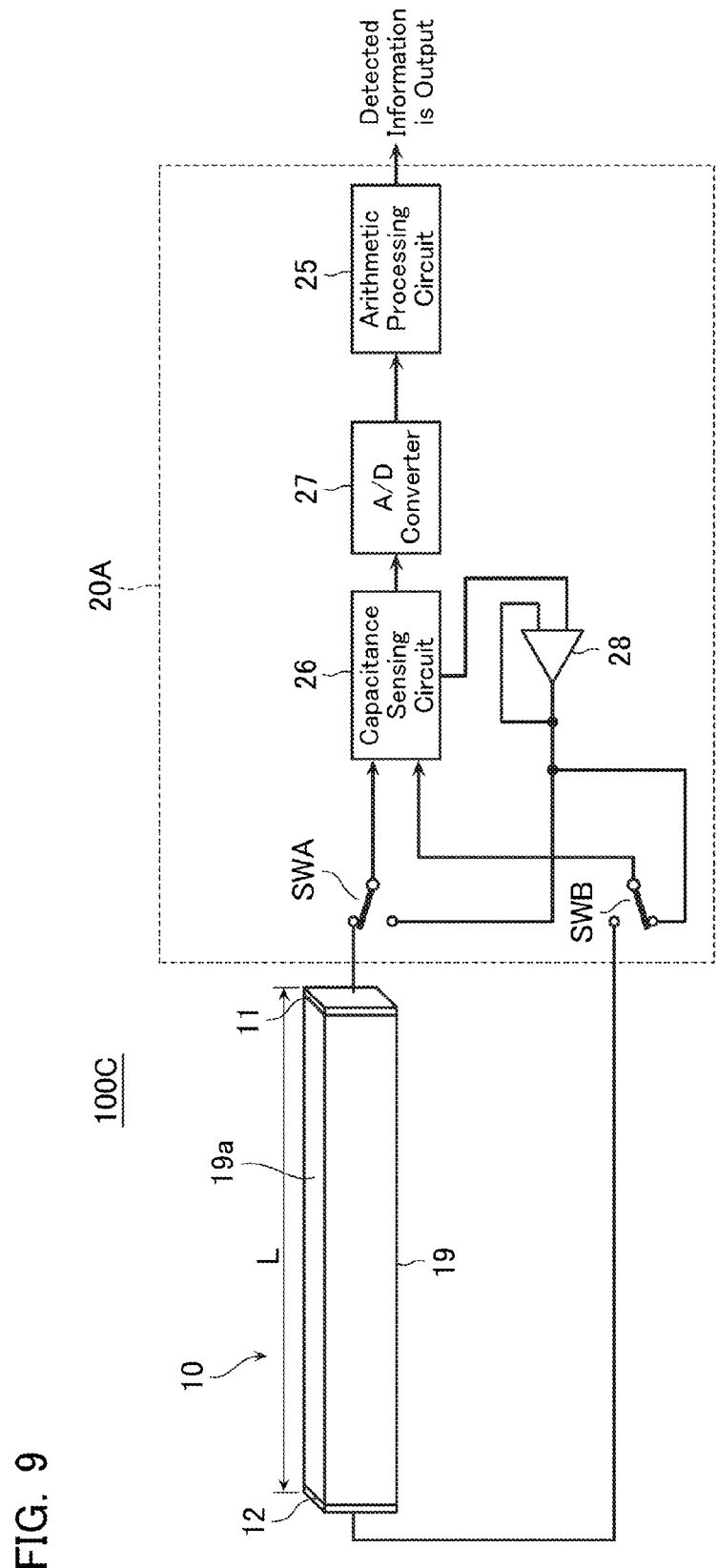
FIG. 9 is an explanatory diagram showing an example of a whole configuration of a position detector according to a fourth embodiment of the present invention.

FIG. 9 is an explanatory diagram showing an example of a whole configuration of a position detector according to a fourth embodiment of the present invention. As shown in FIG. 9, the position detector 100C according to the fourth embodiment is the same as the foregoing examples in that it comprises a capacitance sensor unit and a detecting circuit unit as described above. However, the present embodiment is different from the forgoing examples in the configuration of the detecting circuit unit 20A and the operation of the capacitance sensor unit 10.

That is, the present detecting circuit unit 20A is different in that it comprises a plurality of selector switches SWA and SWB which are connected to the first and second sensing electrodes 11 and 12 respectively, one capacitance sensing circuit 26 and one A/D converter 27, and a dummy detecting circuit 28 which is at the same electric potential as the capacitance sensing circuit 26.

In this case, for example, switching between connection with the capacitance sensing circuit 26 and connection with the dummy detecting circuit 28 through the selector switches SWA and SWB is performed alternately at certain time intervals under a switching control of the arithmetic processing circuit 25 (that is, in a way to connect the sensing electrodes 11 and 12 to the capacitance sensing circuit 26 and the dummy detecting circuit 28 intertemporally).

Specifically, the arithmetic processing circuit 25 performs the processes described above based on a detected value $C1(x)$ that is obtained when the sensing electrode 11 is connected to the capacitance sensing circuit 26 by the selector switch SWA and the sensing electrode 12 is connected to the dummy detecting circuit 28 by the selector switch SWB and a detected value $C2(x)$ that is obtained when the sensing electrode 11 is connected to the dummy detecting circuit 28 by the selector switch SWA and the sensing electrode 12 is connected to the capacitance sensing circuit 26 by the selector switch SWB. In this way, the position of a finger F in the range L of the sensing area on the sensing surface 19a can be judged and detected.

Further, where the sensing circuits 11 and 12 are configured to be connected to the capacitance sensing circuit 26 by, for example, the selector switches SWA and SWB respectively under the switching control of the arithmetic processing circuit 25, the finger F causes capacitance coupling with the sensing electrodes 11 and 12 through the dielectric material 19 when it is approaching the range L of the sensing area. Hence, the distance of the finger F from the sensing surface 19a can also be judged and detected based the capacitance value (detected value) of this time.

According to the configuration of the fourth embodiment, the number of capacitance sensing circuits and the number of A/D converters can be reduced from the numbers included in the detecting circuit unit 20 of the third embodiment described above. This makes it possible to perform correct and secure position judgment/detection and distance judgment/detection of the finger F at a lower cost.

Figure 10:
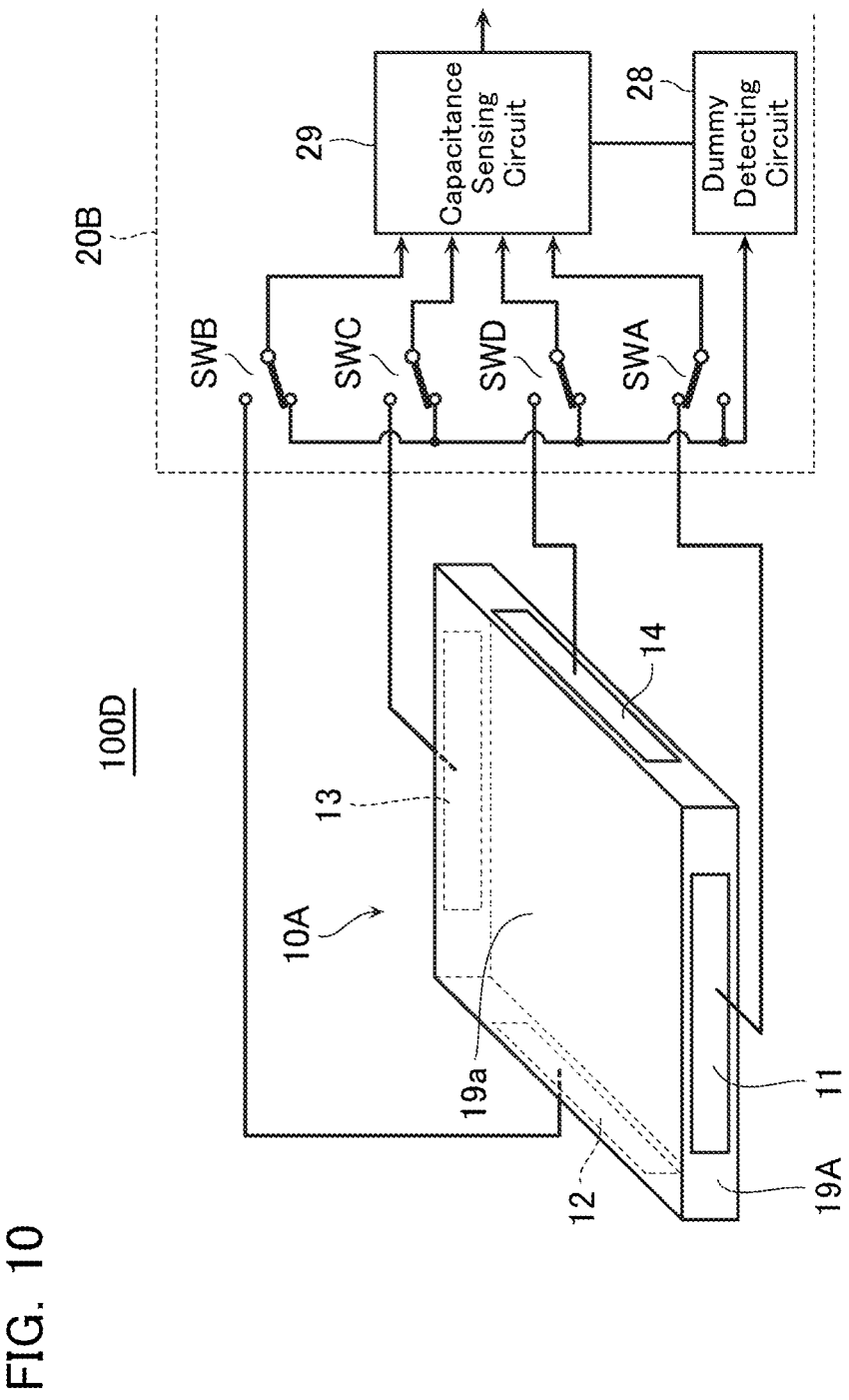
FIG. 10 is an explanatory diagram showing an example of a portion of a whole configuration of a position detector according to a fifth embodiment of the present invention.

FIG. 10 is an explanatory diagram showing an example of a portion of a whole configuration of a position detector according to a fifth embodiment of the present invention. As shown in FIG. 10, the position detector 100D according to the fifth embodiment is the same as the third embodiment and the fourth embodiment in that it comprises a capacitance sensor unit and a detecting circuit unit (only a part of which is illustrated). However, the capacitance sensor unit 10A and the detecting circuit unit 20B are different from the first and second embodiments in the configuration, namely in that they judge and detect the position of the finger F not only in the X direction but also in the Y direction orthogonal to the X direction to be able to perform position judgment/detection and distance judgment/detection two-dimensionally.

That is, the capacitance sensor unit 10A has a dielectric material 19A that is formed into a shape of a flat panel, which has a sensing surface 19a on its principal surface and has a first sensing electrode 11, a second sensing electrode 12, a third sensing electrode 13, and a fourth sensing electrode 14 connected to its four side surfaces that surrounds the sensing surface 19a. The detecting circuit unit 20B includes selector switches SWA, SWB, SWC, and SWD which are connected to these sensing electrodes 11 to 14 respectively and to one capacitance sensing circuit 29 and one dummy detecting circuit 28. With a concern for aesthetic design, etc., the first sensing electrode 11 to fourth sensing electrode 14 may be provided inside the side surfaces of the dielectric material 19.

The position detector 100D having such a configuration performs the following operation, for example. First, an unillustrated arithmetic processing circuit thereof sets an origin (x0, y0) in the range of a rectangular sensing area formed on the sensing surface 19a. When a finger F (unillustrated) is contacting the range of the sensing area on the sensing surface 19a, the arithmetic processing circuit performs simultaneous control of switching of the selector switches SWA to SWD at least four times in this case, and thereby obtains a detected value at each of these times.

That is, when, for example, the selector switch SWA is switched to connect the first sensing electrode 11 to the capacitance sensing circuit 29 as an operation 1, the other selector switches SWB, SWC, and SWD switch the second sensing electrode 12 to the fourth sensing electrode 14 to be connected to the dummy detecting circuit 28. A capacitance value detected by the capacitance sensing circuit 29 based on the capacitance from the first sensing electrode 11 at this time is stored in the arithmetic processing circuit as a detected value $C1(x, y)$.

Next, when, for example, the selector switch SWB is switched to connect the second sensing electrode 12 to the capacitance sensing circuit 29 as an operation 2, the other selector switches SWA, SWC, and SWD switch the first second ond electrode 11, the third sensing electrode 13, and the fourth electrode 14 to be connected to the dummy detecting circuit 28. A capacitance value that is based on the capacitance from the second sensing electrode 12 at this time is stored in the arithmetic processing circuit as a detected value $C2(x, y)$.

Further, when, for example, the selector switch SWC is switched to connect the third sensing electrode 13 to the capacitance sensing circuit 29 as an operation 3, the other selector switches SWA, SWB, and SWD switch the first sensing electrode 11, the second sensing electrode 12, and the fourth sensing electrode 14 to be connected to the dummy detecting circuit 28. A capacitance value that is based on the capacitance from the third sensing electrode 13 at this time is stored in the arithmetic processing circuit as a detected value $C3(x, y)$.

Finally, when, for example, the selector switch SWD is switched to connect the fourth sensing electrode 14 to the capacitance sensing circuit 29 as an operation 4, the other selector switches SWA to SWC switch the first sensing electrode 11 to the third sensing electrode 13 to be connected to the dummy detecting circuit 28. A capacitance value that is based on the capacitance from the fourth sensing electrode 14 at this time is stored in the arithmetic processing circuit as a detected value $C4(x, y)$.

Then, the arithmetic processing circuit judges and detects the X and Y-direction two-dimensional position of the finger F in the range of the sensing area on the sensing surface 19a by performing a comparison operation on these detected values C1 to C4. In this way, the position detector 100D according to the fifth embodiment can judge and detect the position of the finger F in the range of the sensing area on the sensing surface 19a two-dimensionally correctly.

Also the position detector 100D according to the fifth embodiment can perform distance judgment/detection of the finger F from the sensing surface 19a in the range of the sensing area. That is, when performing distance judgment/detection, the position detector 100D switches all of the selector switches SWA to SWD of the detecting circuit unit 20B so as to connect all of the sensing electrodes 11 to 14 of the capacitance sensor unit 10A to the capacitance sensing circuit 29 under a switching control of the arithmetic processing circuit. Then, the arithmetic processing circuit calculates the distance of the finger F (sensing target) from the sensing surface 19a by performing calculation using capacitance values that are based on capacitances sensed by all of these sensing electrodes 11 to 14 between themselves and the finger F that couples to the sensing electrodes 11 to 14 through the dielectric material 19A. The method of calculating the distance will not be explained here because it is a publicly-known art.

In the embodiment described above, by performing position judgment/detection and distance judgment/detection by, for example, switching between them at certain time intervals, it becomes possible to detect the position of the sensing target and the distance thereof from the sensing surface in the range of the sensing area compositively with one position detector. In distance judgment/detection, evaluation is based on a capacitance value to be detected (i.e., a detected value). This value is dependent on both the position in the X direction, etc. of the dielectric material and the distance to the dielectric material. Here, C1/C2, C1/(C1+C2), etc. are substantially not dependent on the distance to the dielectric material but are dependent only on X, etc. Therefore, X, etc. may be obtained first by calculation and then a distance corresponding to the obtained X, etc. may be obtained.

As is clear, the position detector according to the present invention includes a small number of sensing electrodes and has a detecting circuit unit having a simple configuration. Therefore, the position and distance of a sensing target which makes an approach, etc. to the range of the sensing area can be detected securely with a simple configuration and at a low cost. Furthermore, since the dielectric material needs not be made of a transparent or semitransparent material and substantially no space is needed for setting the sensing electrodes (because they are connected to or built in the dielectric material), the latitude of designing the position detector can be improved.

Figure 11:
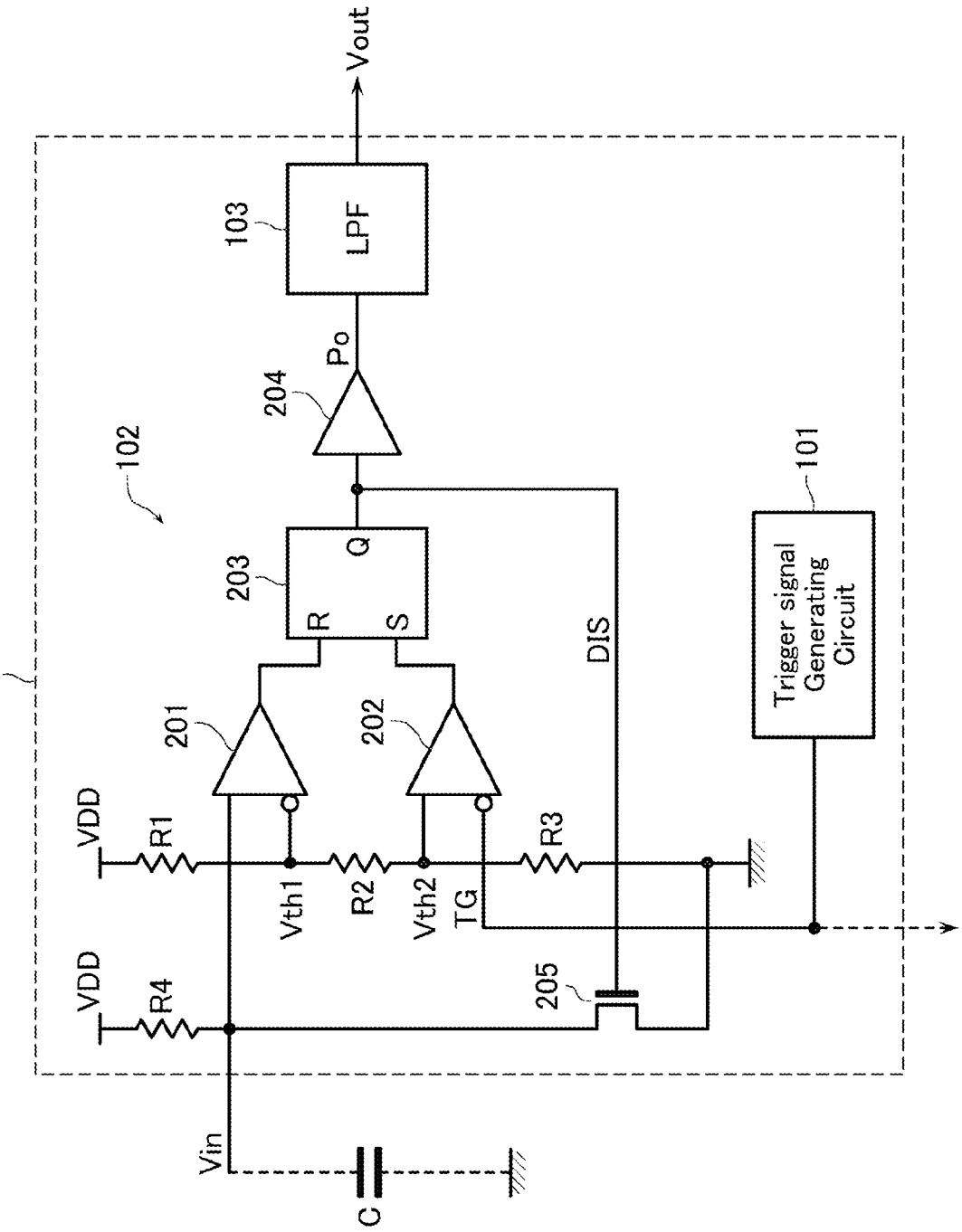
FIG. 11 is a block diagram showing an example of an internal configuration of a capacitance sensing circuit.
Figure 12:
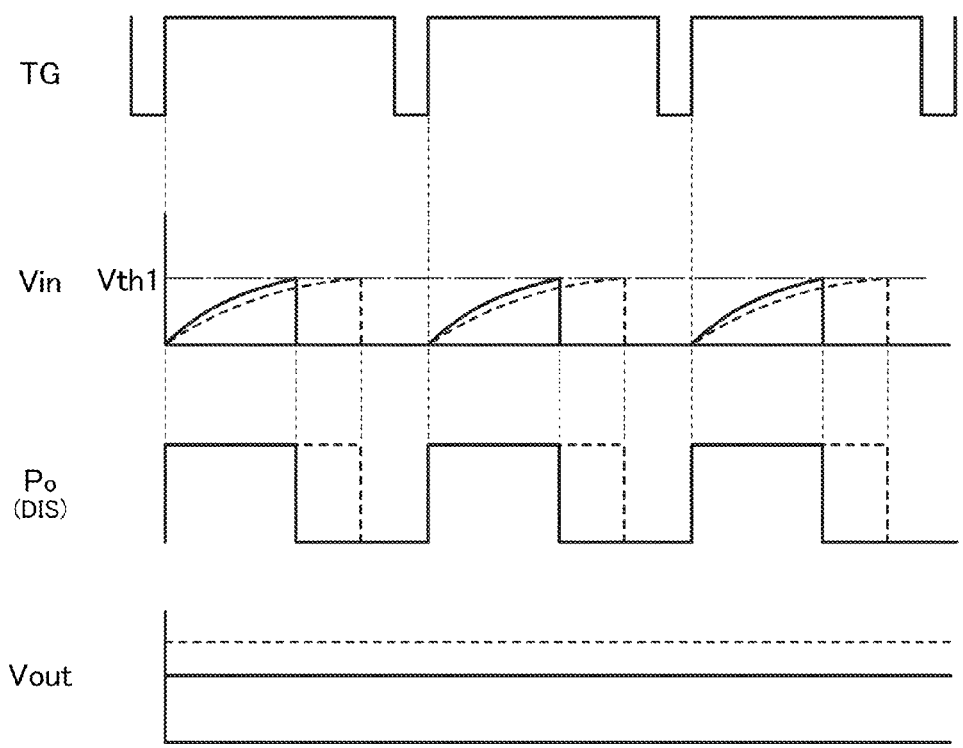
FIG. 12 is an operation waveform chart showing examples of operation waveforms of the capacitance sensing circuit.

FIG. 11 is a block diagram showing an example of an internal configuration of the capacitance sensing circuit. FIG. 12 is an operation waveform chart showing an example of operation waveforms of this capacitance sensing circuit. As shown in FIG. 11, here, the capacitance sensing circuit 21 (22, 26, or 29; the same applies hereinafter) is configured by a so-called C-V converting type circuit which converts a capacitance sensed by the first sensing electrode 11, etc. to a voltage.

For example, as shown in FIG. 11, the capacitance sensing circuit 21 changes its duty ratio according to a capacitance C. The capacitance sensing circuit 21 includes a trigger signal generating circuit 101 which outputs a trigger signal TG having a constant period, for example. The capacitance sensing circuit 21 also includes a timer circuit 102 which outputs a pulse signal Po having a duty ratio which changes according to the level of the capacitance C connected to an input terminal. The capacitance sensing circuit 21 also includes a low-pass filter (LPF) 103 which smoothes this pulse signal.

The timer circuit 102 includes, for example, two comparators 201 and 202, and an RS flip-flop circuit (hereinafter referred to as "RS-FF") 203 which receives the outputs of these two comparators 201 and 202 at its reset terminal R and its set terminal S respectively. The timer circuit 102 also includes a buffer 204 which outputs an output DIS of the RS-FF 203 to the LPF 103, and a transistor 205 which is controlled between on and off according to the output DIS of the RS-FF 203.

The comparator 202 compares such a trigger signal TG as shown in FIG. 12 which is output from the trigger signal generating circuit 101 with a certain threshold Vth2 divided by resistors R1, R2, and R3. Then, the comparator 202 outputs a set pulse synchronized with the trigger signal TG. This set pulse sets the Q output of the RS-FF 203.

The Q output as a discharge signal DIS turns off the transistor 205, and electrically charges between the respective sensing electrodes 11, etc. and the ground at a speed defined by a time constant set by the to-ground capacitance C of the respective sensing electrodes 11, etc. and a resistor R4 connected between the input terminal and a power supply line. Accordingly, the potential of an input signal Vin rises at a speed defined by the capacitance C.

When the input signal Vin exceeds a threshold Vth1 defined by the resistors R1, R2, and R3, the output of the comparator 201 is inverted, thereby inverting the output of the RS-FF 203. As a result, the transistor 205 is turned on, and the charges accumulated in, for example, the sensing electrode 11 are discharged through the transistor 205.

Hence, the timer circuit 102 outputs a pulse signal Po which, as shown in FIG. 12, oscillates at a duty ratio that is based on the capacitance C of the sensing electrodes 11, etc. The LPF 103 outputs a direct-current sensing signal Vout shown in FIG. 12 by smoothing the pulse signal Po.

The sensing signal Vout output by the capacitance sensing circuit 21 in this way is converted to a digital signal by the A/D converter 23, etc. as described above. In FIG. 12, a waveform indicated by a solid line and a waveform indicated by a dotted line show that the former has a smaller capacitance than that of the latter, and, for example, the latter represents a condition that an object is coming close.

In the position detectors 100, 100A, 100B, 100C, and 100D described above, explained as the configuration of the detecting circuit unit 20, 20A, and 20B is one that uses, as the capacitance sensing circuit 21, etc., a well-known timer IC which is a C-V converting type and outputs a pulse having a duty ratio that is changed based on resistors and a capacitor. However, the capacitance sensing circuit is not limited to this. That is, other than the method of measuring the charging time of the C-R series circuit, the followings are known as methods applicable to the capacitance sensing circuit 21, etc.

For example, there is a method of measuring an impedance directly from a voltage change caused by a capacitance value or from a current value by applying a sine wave. There is also a method of configuring an oscillation circuit so as to include a capacitance to be measured and measuring the oscillation frequency. There is also a method of configuring an RC charge/discharge circuit and measuring charging/discharging times. There is also a method of transferring charges accumulated by charging at a known voltage to a known capacity and measuring the voltage of the capacity. Further, there is also a method of performing plural times charging an unknown capacity at a known voltage and transferring the charges to a known capacity, and measuring the number of times taken until the known capacity is charged up to a certain voltage. A threshold may be set for a detected capacitance value or the capacitance sensing circuit may function as a switch by performing such a process as analyzing the signal waveform of the capacitance and starting a triggering operation when a corresponding capacitance waveform appears.

It has been the premise that the capacitance sensing circuit 21, etc. of the detecting circuit units 20, 20A, and 20B convert a capacitance to a voltage. However, the capacitance sensing circuit 21, etc. may convert a capacitance to any data that is easy to process electrically or by software, and may convert a capacitance to, for example, a pulse width, or directly to a digital value.

The position detectors 100, 100A, 100B, 100C, and 100D described above have been explained as examples which have the first sensing electrode 11, the second sensing electrode 12, etc. on the dielectric material 19, etc. and which judge and detect a sensing target by performing comparison, etc. on a detected value C1 and a detected value C2. However, the position detectors may be as follows.

Figure 13:
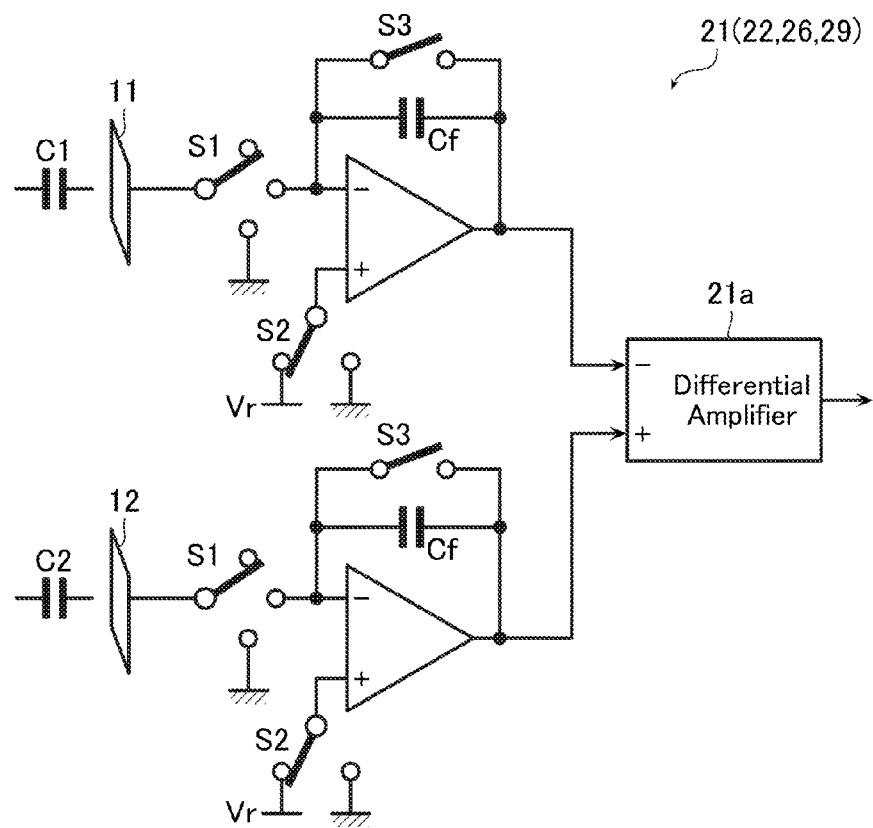
FIG. 13 is a block diagram showing another example of the internal configuration of the capacitance sensing circuit.
Figure 14A:
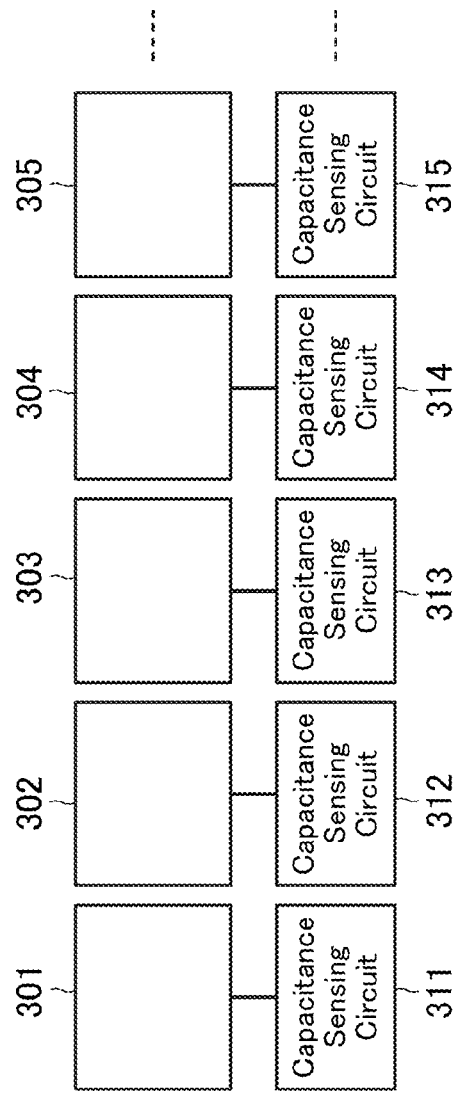
FIG. 14A is an explanatory diagram showing an example of a configuration of a portion of a conventional capacitance type sensor.
Figure 14B:
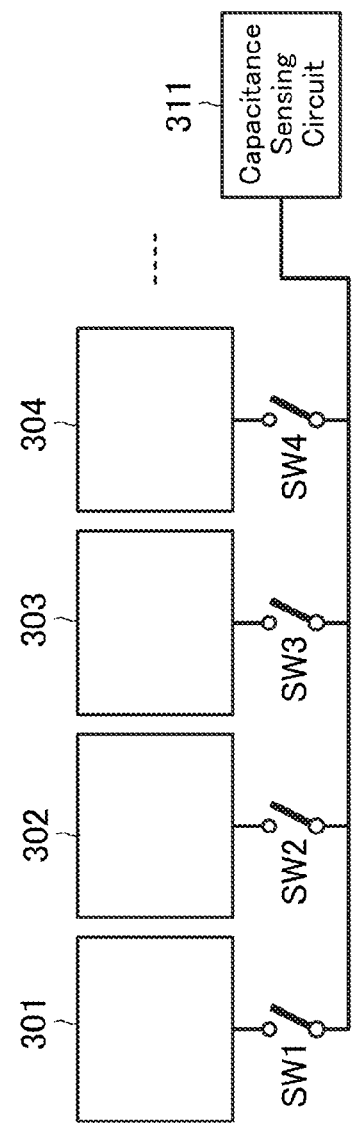
FIG. 14B is an explanatory diagram showing an example of a configuration of a portion of a conventional capacitance type sensor.

FIG. 13 is a block diagram showing another example of the internal configuration of the capacitance sensing circuit. As shown in FIG. 13, the capacitance sensing circuit 21 (22, 26, or 29; the same applies hereinafter) is configured to perform a differential operation by including a differential amplifier circuit 21a. This capacitance sensing circuit 21 employs such a method as described above which transfers charges accumulated by charging at a known voltage to a known capacity and measures the voltage of the capacity. The explanation will be given by taking the first and second sensing electrodes 11 and 12 as the examples of the sensing electrodes.

Specifically, as shown in FIG. 13, for example, the first sensing electrode 11 is connected to a minus-side input terminal of the differential amplifier circuit 21a and the second sensing electrode 12 is connected to the plus-side input terminal thereof. The value of capacitance C1 is subtracted from the value of capacitance C2, and the resulting output value is compared with a threshold by means of a comparator or the like, whereby the sensing target is judged and detected.

Such a capacitance sensing circuit 21 operates in a manner of, for example, when switches S1 are opened (OFF), switches S2 are grounded (GND), and switches S3 are closed (ON), opening the switches S3 (OFF), switching the switches S2 to Vr, and connecting the switches S1 to inverting inputs of operational amplifiers. In response to this, the capacitances C2 and Cf are charged with C2Vr, and the capacitances C1 and Cf are charged with C1Vr.

Then, an output voltage V when the switches S1 are grounded (GND) after the switches S1 have been opened (OFF) and the switches S2 have been grounded (GND) is measured. The voltage at this time is $V/Vr=\{(Cf+C1)/Cf\}-\{(Cf+C2)/Cf\}$, which means that a voltage corresponding to the ratio between the capacitance C2 and the capacitance C1 has been output.

By configuring the capacitance sensing circuit 21 to differentially operate in this way, it is possible to offset the temperature characteristics of the circuit and reduce common-mode noises. When the sensing target is a human body, one of the first and second sensing electrodes 11 and 12 is used as the sensing electrode to detect the human body. The other sensing electrode may be deprived of its sensitivity for the human body by being provided with a shield electrode (unillustrated) on its side facing the sensing area (i.e., the side facing the sensing surface 19a), so that capacitance coupling with the human body occurs at only one sensing electrode.

The selector switches SWA, etc. described above may have any configuration as long as it can switch electrical connection. For example, electronic circuit switches such as FETs, photo MOS relays, etc. and mechanical switches such as contact switches may be used. The shape of the dielectric materials 19 and 19A is not limited to a prism shape and a flat panel shape, but may be a cylindrical shape, a triangular prism shape, and a pentagonal prism shape, or such a shape as a triangle, a polygon, a circle, an ellipse, etc. The cross-sectional shape of the dielectric materials 19 and 19A needs not be formed by parallel sides of a rectangle, but may be formed by inclined sides or a curved surface. In this case, the profile of each shape may be obtained beforehand and reflected in the settings for the position detecting and position judging/detecting operations, etc.

It has been explained that the number of sensing electrodes is two or four, but the position detecting operation described above can be realized by some other numbers such as three, five, etc. The dielectric materials 19 and 19A may be made of a transparent or semitransparent material such as acryl, glass, etc. In this case, the range of the sensing area constituted by the sensing electrode 11, etc. can be made hardly visible from outside. This is advantageous in the aesthetic design and the latitude of designing.

The invention claimed is:

1. A position detector, comprising:
a dielectric material having a sensing surface defining a range of a sensing area;
a plurality of sensing electrodes which are provided in the vicinity of ends of the dielectric material, and which sense a capacitance between themselves and a sensing target;
a detecting circuit which detects capacitance values that are based on sensing signals from the plurality of sensing electrodes;
a plurality of selector switches which are capable of switching the plurality of sensing electrodes respectively between connection to the detecting circuit and connection to a ground potential or a certain fixed potential; and
judging/detecting means which judges and detects at least one of a position of the sensing target on the sensing surface and a distance of the sensing target from the sensing surface based on detection results from the detecting circuit.

2. The position detector according to claim 1,
wherein the judging/detecting means judges and detects the position of the sensing target on the sensing surface based on a result of comparison between outputs from the detecting circuit, the outputs being obtained when the plurality of selector switches are switched so as to connect at least one of the plurality of sensing electrodes to the detecting circuit and the other/s to the ground potential or the fixed potential in order to sequentially switch between the sensing electrodes to select each of them as one to be connected to the detecting circuit.

3. The position detector according to claim 1,
wherein the judging/detecting means judges and detects the distance of the sensing target from the sensing surface based on outputs from the detecting circuit, the outputs being obtained when the plurality of selector switches are switched so as to connect the plurality of sensing electrodes to the detecting circuit respectively.

4. The position detector according to claim 1,
wherein the judging/detecting means judges and detects the distance of the sensing target from the sensing surface based on a sum of outputs from the detecting circuit, the outputs being obtained when the plurality of selector switches are switched so as to connect at least one of the plurality of sensing electrodes to the detecting circuit and the other/s to the ground potential or the fixed potential in order to sequentially switch between the sensing electrodes to select each of them as one to be connected to the detecting circuit.

5. The position detector according to claim 1,
wherein the position of the sensing target on the sensing surface and the distance of the sensing target from the sensing surface are each judged and detected by controlling switching states of the plurality of selector switches at certain time intervals.

6. The position detector according to claim 1,
wherein the detecting circuit includes: a plurality of capacitance sensing circuits which are connected one-to-one to the plurality of sensing electrodes through the plurality of selector switches respectively and which output information indicating capacitances sensed by the sensing electrodes respectively; and synchronizing means which synchronizes the capacitance sensing circuits,
the judging/detecting means is configured by an arithmetic processing circuit which judges and detects at least one of the position of the sensing target on the sensing surface and the distance of the sensing target from the sensing surface by performing a comparison operation on capacitance values which are based on the information from the plurality of capacitance sensing circuits.

7. The position detector according to claim 1,
wherein the detecting circuit includes a capacitance sensing circuit which is connected to the plurality of sensing electrodes through the plurality of selector switches respectively and which outputs information indicating capacitances sensed intertemporally by the sensing electrodes under a switching control on the selector switches, and
the judging/detecting means is configured by an arithmetic processing circuit which judges and detects at least one of the position of the sensing target on the sensing surface and the distance of the sensing target from the sensing surface by performing a comparison operation on capacitance values which are based on the information from the capacitance sensing circuit.

8. A position detector, comprising:
a dielectric material having a sensing surface defining a range of a sensing area;
a plurality of sensing electrodes which are provided in the vicinity of ends of the dielectric material and which sense a capacitance between themselves and a sensing target;
a detecting circuit which detects capacitance values which are based on sensing signals from the sensing electrodes;
a dummy detecting circuit which supplies a same potential as that of any of the sensing electrodes that is connected to the detecting circuit to the other sensing electrode/s;
a plurality of selector switches which are capable of switching the plurality of sensing electrodes respectively between connection to the detecting circuit and connection to the dummy detecting circuit; and
judging/detecting means which judges and detects at least one of a position of the sensing target on the sensing surface and a distance of the sensing target from the sensing surface based on detection results from the detecting circuit.

9. The position detector according to claim 8,
wherein the judging/detecting means judges and detects the position of the sensing target on the sensing surface based on a result of comparison between outputs from the detecting circuit, the outputs being obtained when the plurality of selector switches are switched so as to connect at least one of the plurality of sensing electrodes to the detecting circuit and the other/s to the dummy detecting circuit in order to sequentially switch between the sensing electrodes to select each of them as one to be connected to the detecting circuit.

10. The position detector according to claim 8, wherein the judging/detecting means judges and detects the distance of the sensing target from the sensing surface based on outputs from the detecting circuit, the outputs being obtained when the plurality of selector switches are switched so as to connect the plurality of sensing electrodes to the detecting circuit respectively.

11. The position detector according to claim 8, wherein the judging/detecting means judges and detects the distance of the sensing target from the sensing surface based on a sum of outputs from the detecting circuit, the outputs being obtained when the plurality of selector switches are switched so as to connect at least one of the plurality of sensing electrodes to the detecting circuit and the other/s to the dummy detecting circuit in order to sequentially switch between the sensing electrodes to select each of them as one to be connected to the detecting circuit.

12. The position detector according to claim 8, wherein the position of the sensing target on the sensing surface and the distance of the sensing target from the sensing surface are each judged and detected by controlling switching states of the plurality of selector switches at certain time intervals.

13. The position detector according to claim 8, wherein the detecting circuit includes: a plurality of capacitance sensing circuits which are connected one-to-one to the plurality of sensing electrodes through the plurality of selector switches respectively and which output information indicating capacitances sensed by the sensing electrodes respectively; and synchronizing means which synchronizes the capacitance sensing circuits, and the judging/detecting means is configured by an arithmetic processing circuit which judges and detects at least one of the position of the sensing target on the sensing surface and the distance of the sensing target from the sensing surface by performing a comparison operation on capacitance values which are based on the information from the plurality of capacitance sensing circuits.

14. The position detector according to claim 8, wherein the detecting circuit includes a capacitance sensing circuit which is connected to the plurality of sensing electrodes through the plural of selector switches respectively and which outputs information indicating capacitances which are sensed intertemporally by the sensing electrodes under a switching control on the selector switches, and the judging/detecting means is configured by an arithmetic processing circuit which judges and detects at least one of the position of the sensing target on the sensing surface and the distance of the sensing target from the sensing surface by performing a comparison operation on capacitance values which are based on the information from the capacitance sensing circuit.

15. A position detector, comprising:
a dielectric material having a sensing surface defining a range of a sensing area;
a plurality of sensing electrodes which are provided in the vicinity of ends of the dielectric material and which sense a capacitance between themselves and a sensing target;
a plurality of detecting circuits which detect capacitance values which are based on sensing signals from the plurality of sensing electrodes respectively, the plurality of detecting circuits being synchronized periodically; and
judging/detecting means which judges and detects at least one of a position of the sensing target on the sensing surface and a distance of the sensing target from the sensing surface based on outputs from the plurality of detecting circuits.

16. The position detector according to claim 15, wherein the judging/detecting means judges and detects the position of the sensing target on the sensing surface based on a result of comparison between the outputs from the plurality of detecting circuits.

17. The position detector according to claim 15, wherein the judging/detecting means judges and detects the distance of the sensing target from the sensing surface based on a sum of the outputs from the plurality of detecting circuits.

18. The position detector according to claim 1, wherein the dielectric material is made of a transparent or semitransparent material and formed into a cylindrical shape, a prism shape, or a flat panel shape.

19. The position detector according to claim 1, comprising shield electrodes which are provided on back surfaces of the plurality of sensing electrodes opposite to their electrode surfaces, the shield electrodes being driven at a sensor potential while being insulated from the sensing electrodes respectively and shielding against sensing on the back surfaces of the plurality of sensing electrodes.

20. The position detector according to claim 1, comprising shield electrodes which are provided in a same plane as electrode surfaces of the plurality of sensing electrodes so as to surround circumferences of the electrode surfaces, the shield electrodes being driven at a sensor potential while being insulated from the sensing electrodes respectively and shielding against sensing on the circumferences of the plurality of sensing electrodes.

* * * * *